United States Patent
Boujamaa et al.

(10) Patent No.: US 10,910,031 B2
(45) Date of Patent: Feb. 2, 2021

(54) INPUT CIRCUIT DEVICES FOR SENSE AMPLIFIER CIRCUITS

(71) Applicant: Arm Limited, Cambridge (GB)

(72) Inventors: El Mehdi Boujamaa, Valbonne (FR); Cyrille Nicolas Dray, Antibes (FR)

(73) Assignee: Arm Limited, Cambridge (GB)

(*) Notice: Subject to any disclaimer, the term of this patent is extended or adjusted under 35 U.S.C. 154(b) by 0 days.

(21) Appl. No.: 16/418,821

(22) Filed: May 21, 2019

(65) Prior Publication Data
US 2020/0372942 A1 Nov. 26, 2020

(51) Int. Cl.
G11C 11/16 (2006.01)

(52) U.S. Cl.
CPC ...... *G11C 11/1673* (2013.01); *G11C 11/1659* (2013.01); *G11C 11/1697* (2013.01)

(58) Field of Classification Search
CPC .......... G11C 11/00; G11C 11/02; G11C 11/06
See application file for complete search history.

(56) References Cited

U.S. PATENT DOCUMENTS

| 2003/0156447 A1* | 8/2003 | Kozicki | B82Y 10/00 365/151 |
| 2014/0177321 A1* | 6/2014 | Park | G11C 13/004 365/148 |
| 2016/0260466 A1* | 9/2016 | Katayama | G11C 11/1673 |
| 2017/0110171 A1* | 4/2017 | Seo | G11C 11/1673 |
| 2019/0180173 A1* | 6/2019 | Torng | G06N 3/063 |

* cited by examiner

*Primary Examiner* — Han Yang
(74) *Attorney, Agent, or Firm* — Pramudji Law Group PLLC; Ari Pramudji

(57) ABSTRACT

According to certain implementations of the present disclosure, an input circuit provides one or more reference paths and bit paths for sense amplifier circuit operations. In one implementation, the input circuit includes a reference path, a bit path, and a CMOS resistor. The reference path includes a first MTJ device and a first access device, where the reference path is coupled to the sense amplifier via a first input terminal. The bit path includes a second MTJ device and a second access device, where the bit path is coupled to the sense amplifier via a second input terminal. In certain implementations, the CMOS resistor is coupled to one of the reference path or the bit path.

22 Claims, 19 Drawing Sheets

INPUT CIRCUIT DEVICES FOR SENSE AMPLIFIER CIRCUITS

I. FIELD

The present disclosure is generally related to input circuit devices for sense amplifier circuits.

II. DESCRIPTION OF RELATED ART

Unlike conventional random-access memory (RAM) chip technologies, in magnetic RAM (MRAM), data is not stored as electric charge but is instead stored by magnetic polarization of storage elements. The storage elements are formed from two ferromagnetic layers separated by a tunneling layer. One of the two ferromagnetic layers that is referred to as the fixed layer or pinned layer has a magnetization that is fixed in a particular direction. The other ferromagnetic magnetic layer that is referred to as the free layer has a magnetization direction that can be altered to represent either a "1" when the free layer magnetization is anti-parallel to the fixed layer magnetization or "0" when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel with each other. A memory device, such as MRAM, is built from an array of individually addressable MTJs.

To read data in a conventional MRAM, a read-current flows through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bit-cell of the MRAM. The two different resistances represent a logic "0" and a logic "1" value stored by the MTJ. The two distinct resistances of the MTJ in a bit-cell of the MRAM is illustrated as low-resistive state (LRS) and high-resistive state (HRS) distributions when comparing the log number of read operation samples and the resistance (kΩ) on a two-dimensional Cartesian graph.

Current sense amplifiers are special-purpose amplifiers that output a voltage proportional to the current flowing in a power rail. Generally, these amplifiers utilize a current-sense "resistor-like" device to convert a load current in a power rail to a small voltage, which is then amplified by the current-sense amplifiers. For reading MTJ devices in a bit-cell of an MRAM, a conventional sensing circuit may be used to determine the differential voltage and a conventional current sense amplifier may be used to amplify the differential voltage to an amplified voltage. Accordingly, the conventional current sense amplifier's output may be used to detei mine (i.e., read) the logical state of the MRAM bit-cell.

For this process, as inputs to the current or voltage sense amplifiers, current or voltage from a reference memory path (i.e., reference memory element, reference path) may be compared to that of a bit memory path (i.e., bit memory element, bit path). Reference paths may be built with either pure complementary metal oxide semiconductor (CMOS) devices (e.g., reference devices may include transistors and/or poly-resistors, etc.) or as MTJ-based devices. One drawback of utilizing pure CMOS references is that there can be global process, voltage, and temperature (PVT) variation on the LRS and the HRS. Because of global PVT variation, accurate tracking capability may be prevented, and thus, the difficulty of performing read operations in all conditions is increased. Moreover, on the other hand, a disadvantage of utilizing MTJ-based references is that they can require additional refreshes at high temperatures (i.e., temperatures above the MTJ device qualification as determined based on the particular application (e.g., between 85° C. and 125° C.) to prevent non-stability and functionality issues when performing read operations.

Accordingly, there is a need in the art for economical and stable reference and bit path circuits that can be utilized in sense amplifier circuit operations that allow for accurate tracking capability with fewer circuit components and less system complexity.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, systems, circuits or apparatuses described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., apparatus claims, etc.), or to a particular claim. Therefore, the following detailed description is not to be taken to limit claimed subject matter and/or equivalents.

IV. DETAILED DESCRIPTION

According to certain example implementations of the present disclosure, an input circuit provides one or more reference paths and bit paths for sense amplifier circuit operations. In one implementation, the input circuit includes a reference path, a bit path, and a CMOS resistor. The reference path includes a first MTJ device and a first access device, where the reference path is coupled to the sense amplifier via a first input terminal. The bit path includes a second MTJ device and a second access device, where the bit path is coupled to the sense amplifier via a second input terminal. In certain implementations, the CMOS resistor is coupled to one of the reference path or the bit path.

According to one implementation of the present disclosure, a reference memory element calibrates a reference path for sense amplifier circuit operations. The reference memory element comprises an MTJ device in a low resistive state, an access device, and a CMOS resistor. The impedance of the reference memory element may be between the low resistive state and a high resistive state.

According to another implementation of the present disclosure, a bit memory element calibrates a bit path for sense amplifier circuit operations. The reference memory element comprises an MTJ device in a high resistive state, an access device, and a CMOS resistor. The impedance of the bit memory element may be one of greater than and less than the high resistive state.

Particular implementations of the present disclosure are described below with reference to the drawings. In the description, common features are designated by common reference numbers throughout the drawings.

Figure 1A:
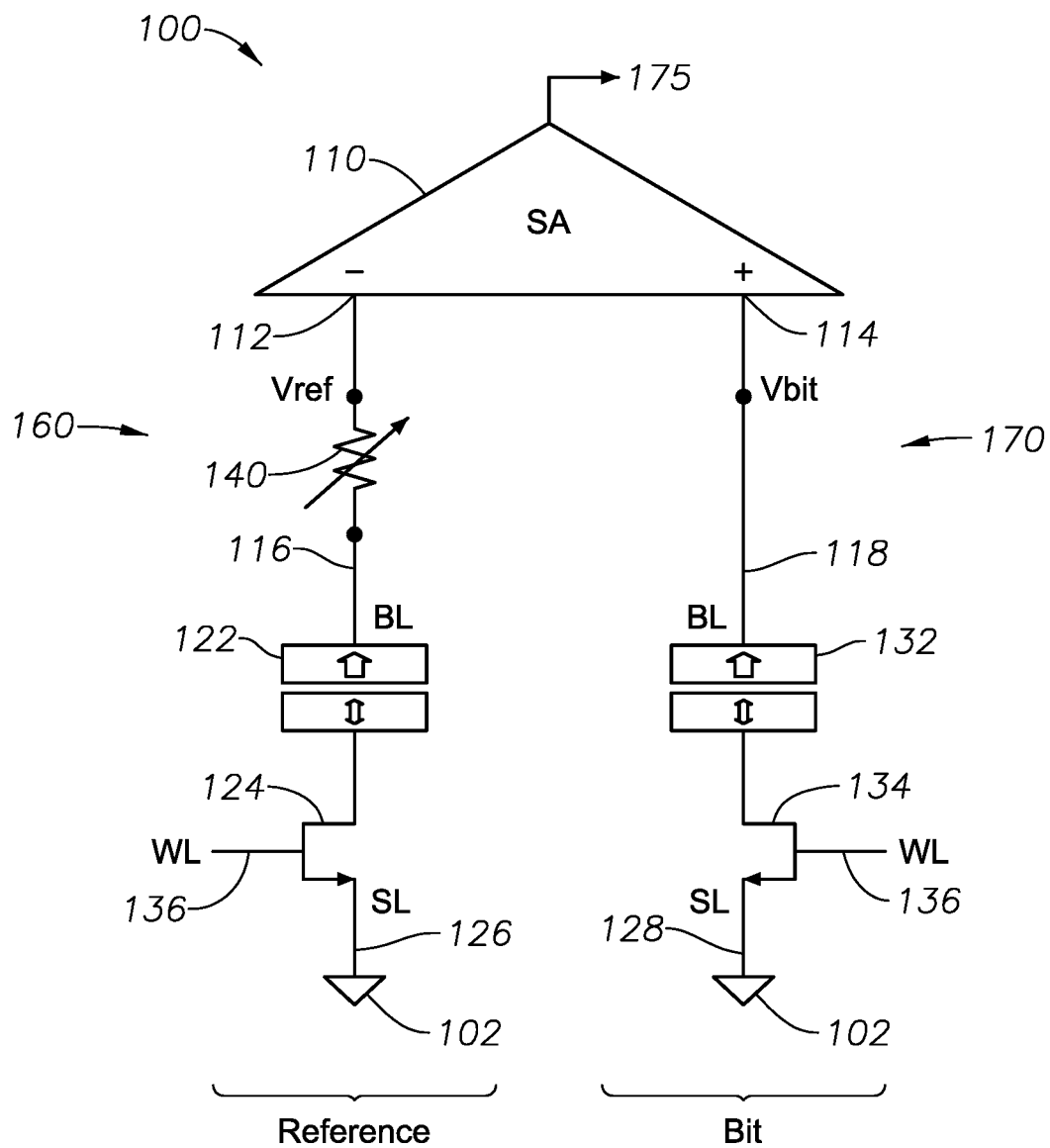
FIGS. 1A-1B are input circuits for asense amplifier according to certain embodiments.
Figure 1B:
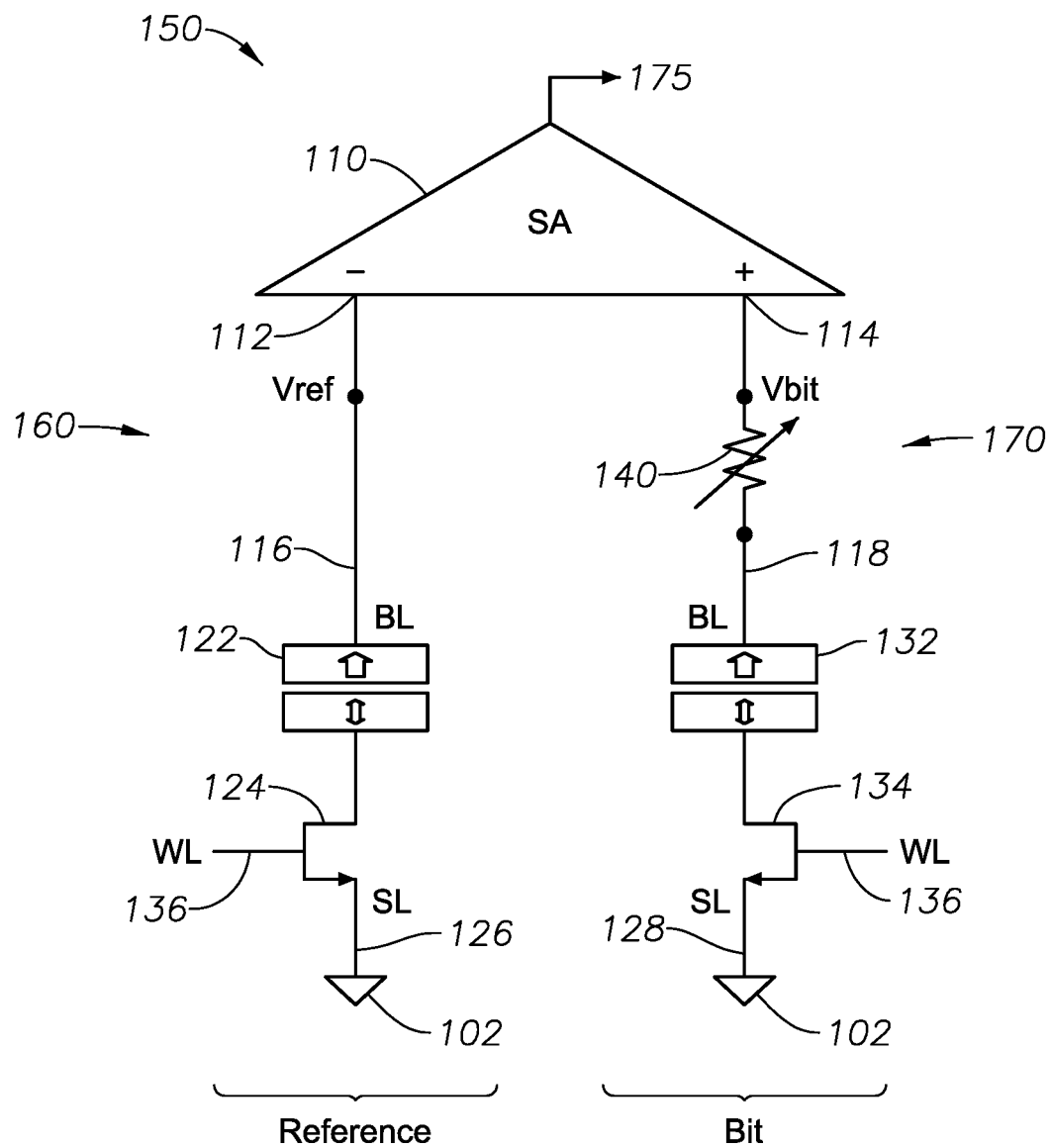

Referring to FIGS. 1A-1B, input circuits 100 and 150, respectively, (e.g., current or voltage sense amplifier input arrangements) having a single MTJ reference path 160 and bit path 170 for an example sense amplifier 110 are shown. Each of the circuits 100, 150 illustrates a reference path 160 (i.e., reference, reference element, reference memory element, reference circuit) (including a reference impedance) and a bit path 170 (i.e., bit, bit element, bit memory element, bit circuit) (including a bit impedance) coupled via first and second input terminals (e.g., negative and positive input terminals, or alternatively, positive and negative input terminals) 112, 114, respectively, of the sense amplifier 110. As discussed herein, for each of the circuit configurations, the first and second input terminals 112, 114 may be interchangeable as positive or negative input terminals. The reference path 160 includes a first MTJ device 122 (e.g., an LRS MTJ or an HRS MTJ) and a first access device 124. The bit path 170 includes a second MTJ device 132 and a second access device 134. Also, each of the circuits 100, 150 includes a CMOS resistor 140 (i.e., a CMOS resistor shifter, a CMOS resistor element, a resistive offset) (e.g., a CMOS-based transistor and/or PDK resistors) coupled to either the reference path 160 (FIG. 1A) or the bit path 170 (FIG. 1B). In alternative embodiments, each of the circuits 100, 150 may be coupled to two or more reference paths (such as the plurality of reference paths 660) and two or more bit paths (such as the plurality of bit paths 670) as described, for example, with reference to FIGS. 6A-6B.

In one implementation, as shown in input circuit 100 (FIG. 1A), a single MTJ 122 (i.e., the first MTJ device, the LRS resistive memory element) in a low-resistance state (LRS) may be used as part of the reference for the sense amplifier 110. For such an implementation, the reference path 160 is a "a mixed reference scheme" comprising the first MTJ device 122 and the CMOS resistor 140, as well as the first access device 124. The bit path 170 includes a second MTJ device 132 (low-resistance state/high-resistance state resistive memory element 132 (LRS/HRS 132)) and a second access device 134. As illustrated, the CMOS resistor 140 serves as a resistive offset that is coupled in series to the LRS MTJ 122 and the first access device 124, such that a total reference impedance of the reference path 160 is in between an LRS and a HRS. Hence, the total reference impedance of the reference path 160 can be built such that it may distinguish between an LRS and an HRS of the corresponding bit path 170. As an advantage of using the LRS reference scheme of FIG. 1A, the reference path is more stable than an FIRS state and is able to sustain higher temperatures. Accordingly, fewer or even zero refreshes would be needed at high temperatures (i.e., temperatures above MTJ qualification). Hence, high temperature operation may be performed with far greater ease.

In an alternative implementation, as shown in input circuit 150 (FIG. 1B), a single MTJ (i.e., the first MTJ device 122, the HRS resistive memory element) in a high-resistance state (HRS) may be used as a reference for the sense amplifier 110. For such an implementation, the bit path 170 is a "mixed bit scheme" including a second MTJ device 132 (low-resistance state/high-resistance state resistive memory element 132 (LRS/HRS 132)), a second access device 134, and the CMOS resistor 140, while the reference path 160 comprises the first MTJ device 122 (i.e., the HRS MTJ device 122) and the first access device 124. As illustrated, the CMOS resistor 140 serves as a resistive offset that is coupled in series to the second MTJ device 132 and the second access device 134, such that a total bit impedance of the bit path 170 is either below an HRS (e.g., when the second MTJ device 132 is in an LRS) or above the HRS (e.g., when the second MTJ device 132 is in the HRS). As an advantage of using an HRS reference scheme, the reference path can be capable of tracking MTJ parameters, such as tunnel magnetoresistance (TMR) variation with respect to voltage.

As shown in FIGS. 1A-1B, the first and second MTJ devices 122, 132 comprise resistive memory elements capable of switching between a high-impedance state (i.e., HRS) and a low-impedance state (LRS), so as to permit storage of logic values, such as a logic "0" and a logic "1." As one example, with reference to FIG. 1A, the first MTJ device 122 may store a logic "0" responsive to placing the memory element into a low-impedance state, and the second MTJ device 132 may store a logic "1" responsive to placement of the memory element into a high impedance state. In alternative examples, the first MTJ device 122 may store a logic "1", while the second MTJ device may store a logic "0".

In the case of FIGS. 1A-1B, a read operation may be performed on the bit-line (BL) as the reference path 160 bit line 116 is coupled to a reference node ($V_{REF}$) and the first input terminal 112, while the bit path 170 bit line 118 is coupled to a bit node ($V_{BIT}$) and the second input terminal 114. For example, responsive to a voltage signal at an example word-line 136, which may permit a current to conduct from an input voltage $V_{BL}$ and flow through the sense amplifier 110, the sense amplifier 110 would provide an output logic signal 175. In particular implementations, the output logic signal 175 may comprise a two-state output signal, such as a signal comprising a relatively low voltage, responsive to a presence of a voltage signal at node $V_{BIT}$ comprising a value less than a voltage signal at $V_{REF}$. A second state of the logic signal 175 may comprise a relatively high voltage, responsive to a presence of a signal at node $V_{BIT}$ comprising a value greater than a voltage signal at $V_{REF}$. In non-limiting examples, the sense amplifier 110 may operate differently, such as to provide a relatively high voltage responsive to a presence of a voltage at signal node $V_{BIT}$ comprising a value greater than a voltage signal at $V_{REF}$ and providing a relatively low voltage responsive to a presence of a signal at node $V_{BIT}$ comprising a value less than a voltage signal at $V_{REF}$. As described with reference to FIGS. 3A-11B, similar read operations may be performed on the source line and the bit line with other input circuit implementations according to the respective input circuit arrangements.

Advantages of using a mixed reference scheme (e.g., as shown in FIG. 1A) or a mixed bit scheme (e.g., as shown in FIG. 1B) also include a reference that can track MTJ global variation, and as a consequence of a single MTJ being using for the reference path instead of two MTJs, the reference path would also optimize circuit design in terms of performance, power, and area (i.e., optimal PPA). Also, because CMOS resistors have significantly smaller variability as compared to MTJ devices, overall reference variability can be reduced. Further, depending on the particular sense amplifier design, "reference dithering" (i.e., randomization) may also be employed to achieve greater read margin (as described below with reference to FIGS. 8A-B, 9A-B, and 11A-B). Moreover, in particular implementations, both the mixed reference scheme and mixed bit scheme may be used with both voltage and current sense amplifiers.

Figure 2:
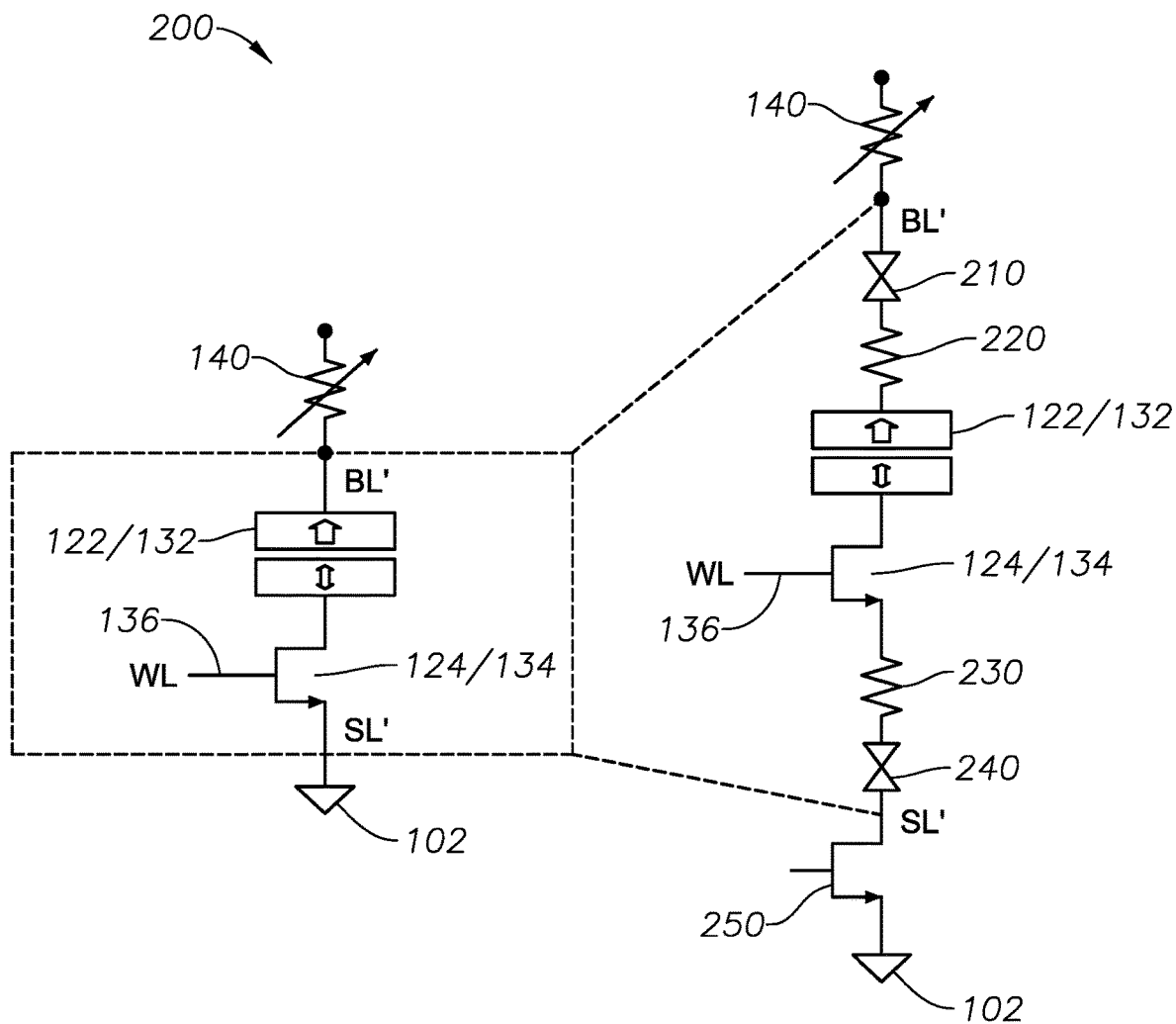
FIG. 2 is a circuit diagram of a reference path or bit path of an input circuit according to certain embodiments.

Referring to FIG. 2, a comprehensive resistance path 200 corresponding to the single MTJ reference path 160 or the single MTJ bit path 170 for the example sense amplifier 110 is shown. As illustrated, along with the single MTJ (e.g., either the reference path MTJ device 122 having a known LRS/HRS value or the bit path MTJ device 132 with an unknown value (either HRS or LRS)) and the access device (e.g., either the first access device 124 or the second access device 134), the comprehensive resistance path 200 includes a bit line multiplexer 210, a bit line parasitic resistance 220, a source line multiplexer 230, a source line parasitic resistance 240, and a read pull-down device 250.

Figure 3A:
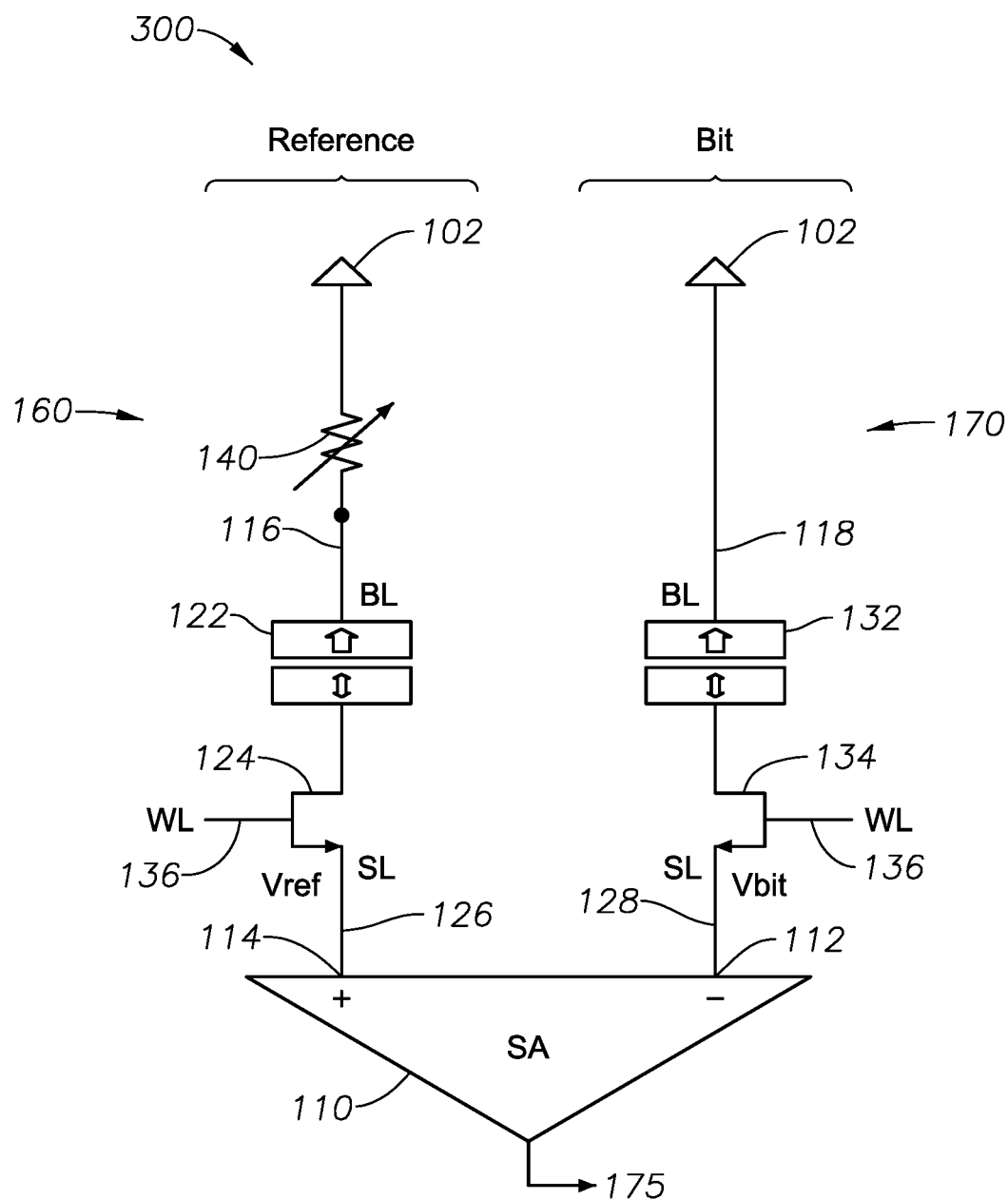
FIGS. 3A-3B are input circuits for an example sense amplifier according to certain embodiments.
Figure 3B:
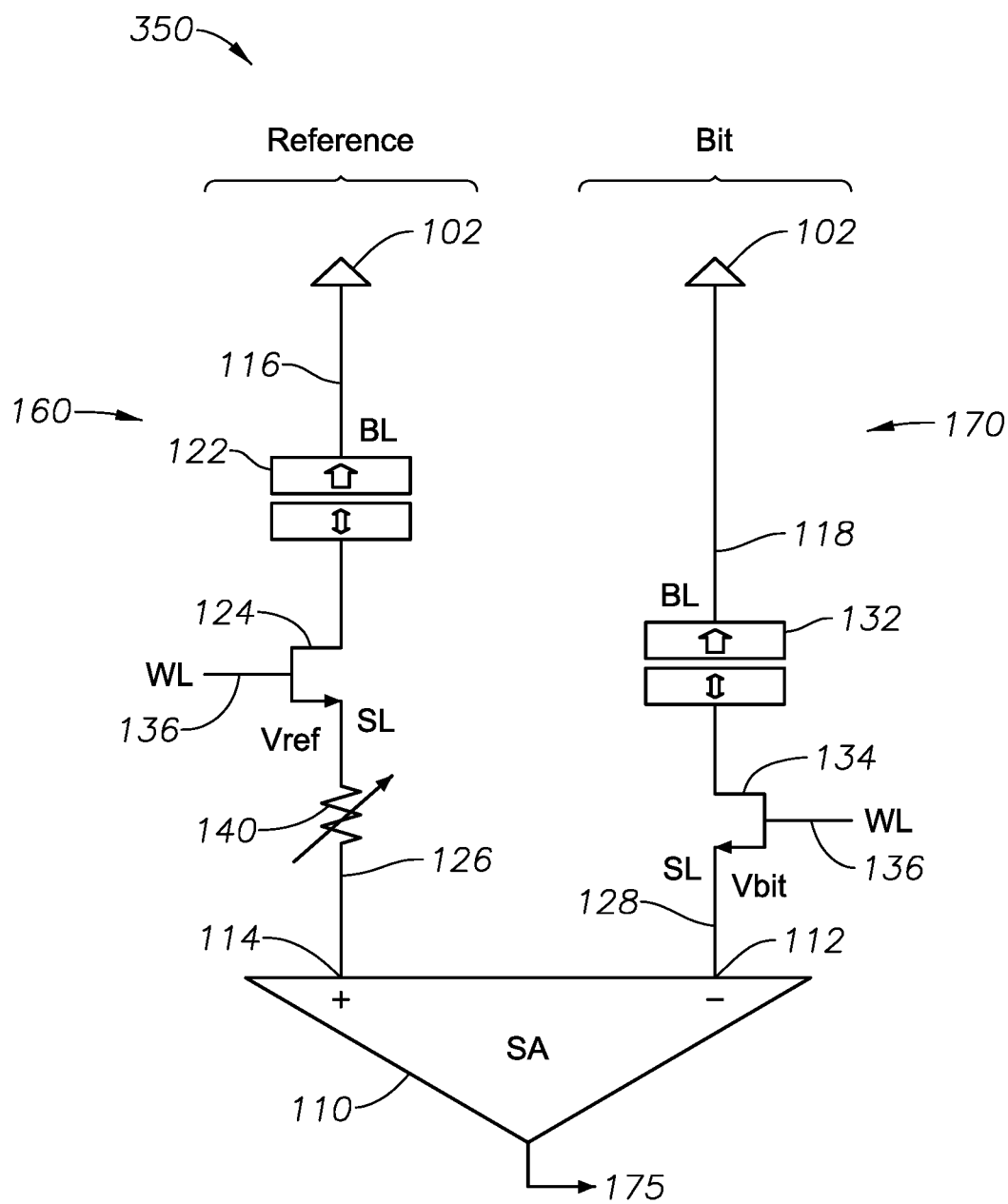

Referring to FIGS. 3A and 3B, in input circuits 300 and 350, respectively, reference paths 160 and bit paths 170 for performing read operations on the source line (SL), using implementations of the single LRS MTJ (i.e., the first MTJ device 122) reference scheme are shown. As shown in FIGS. 3A-3B, the reference path 160 includes the CMOS resistor 140, the first MTJ device 122, and the first access device 124 coupled in series from ground 102 to a second input terminal 114 of the sense amplifier 110. Also, in FIGS. 3A-3B, the bit path 170 includes the second MTJ device 132 (of unknown value being either HRS or LRS) coupled to ground 102 on the bit line (BL) 118, while the second access device 134 is coupled to the first input terminal 112 on the SL 128. In contrast between input circuits 300 and 350, in input circuit 300, on the reference path 160, the CMOS resistor 140 is coupled between the first MTJ device 122 and ground 102 on the bit line (BL) 116, while the first access device 124 is coupled to the second input terminal 114 on the SL 126. In input circuit 350, on the reference path 160, the CMOS resistor 140 is coupled between the first access device 124 and the second input terminal 114 on the SL 126, while the first MTJ device is 122 is coupled between the first access device 124 and ground 102 on the BL 116.

As an example, referring back to input circuit 100 in FIG. 1A, a reference path 160 and bit path 170, for performing read operations on the bit line (BL), using implementations of the single LRS MTJ (i.e., the first MTJ device 122) reference scheme is shown. Further to the description in above paragraphs, on the reference path 160, the CMOS resistor 140 is coupled on the BL 116 between the first MTJ device 122 and the first input terminal 112, while the first access device 124 is coupled on the SL 126 to ground 102. Also, on the bit path 170, the second MTJ device 132 is coupled on the BL 118 between the second access device 134 and the second input terminal 114, while the second access device 134 is coupled to ground on the SL 128. In another implementation (not shown), on the reference path 160, the CMOS resistor 140 is coupled on the SL 126 between the first access device 124 and ground 102, while the first MTJ device 122 is coupled on the BL 116 between the first access device 124 and the first input terminal 112. Also, in this implementation, on the bit path 170, the second MTJ device 132 is coupled on the BL 118 between the second access device 134 and the second input terminal 114, while the second access device 134 is coupled to ground on the SL 128.

Figure 4A:
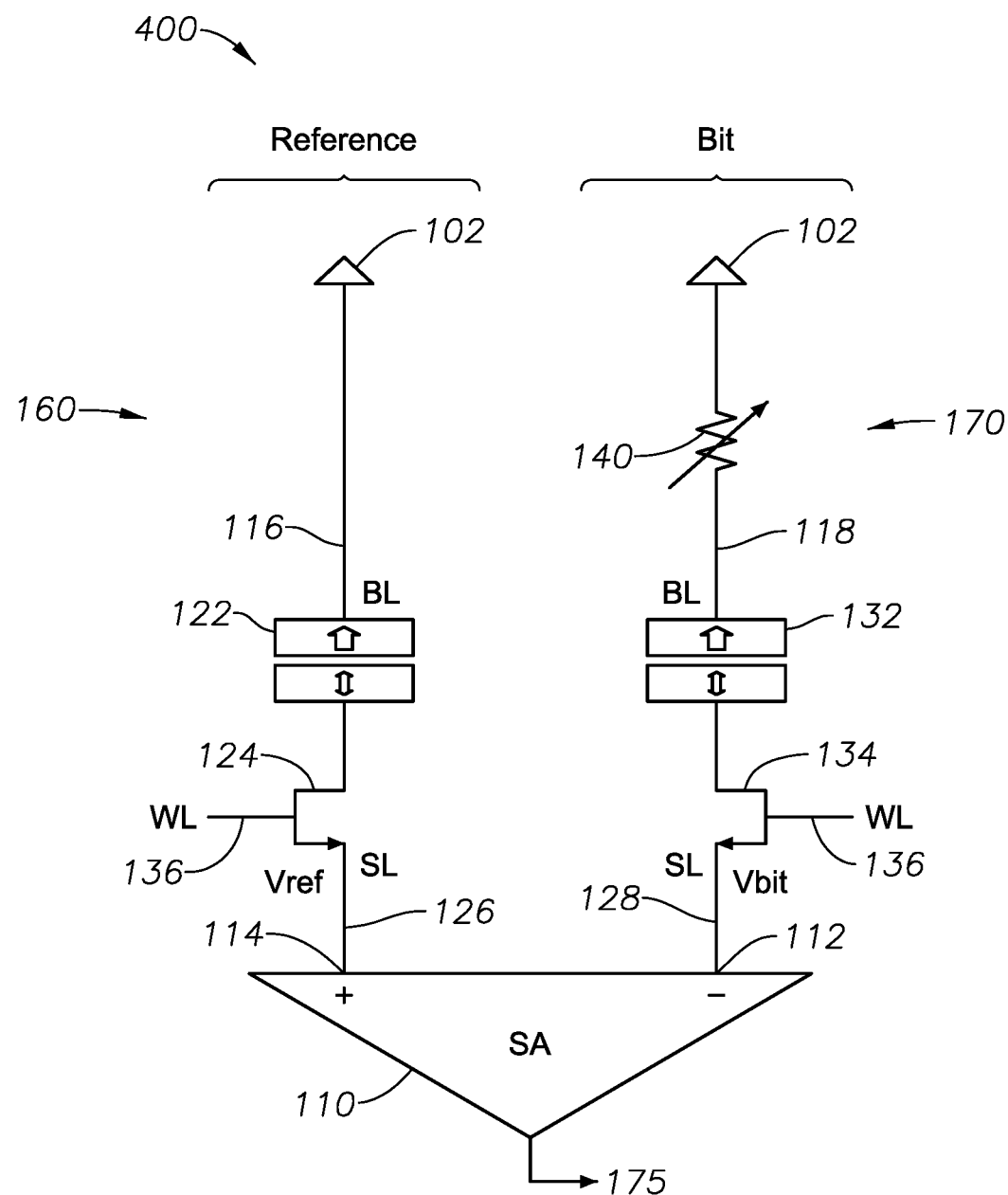
FIGS. 4A-4B are input circuits for a sense amplifier according to certain embodiments.
Figure 4B:
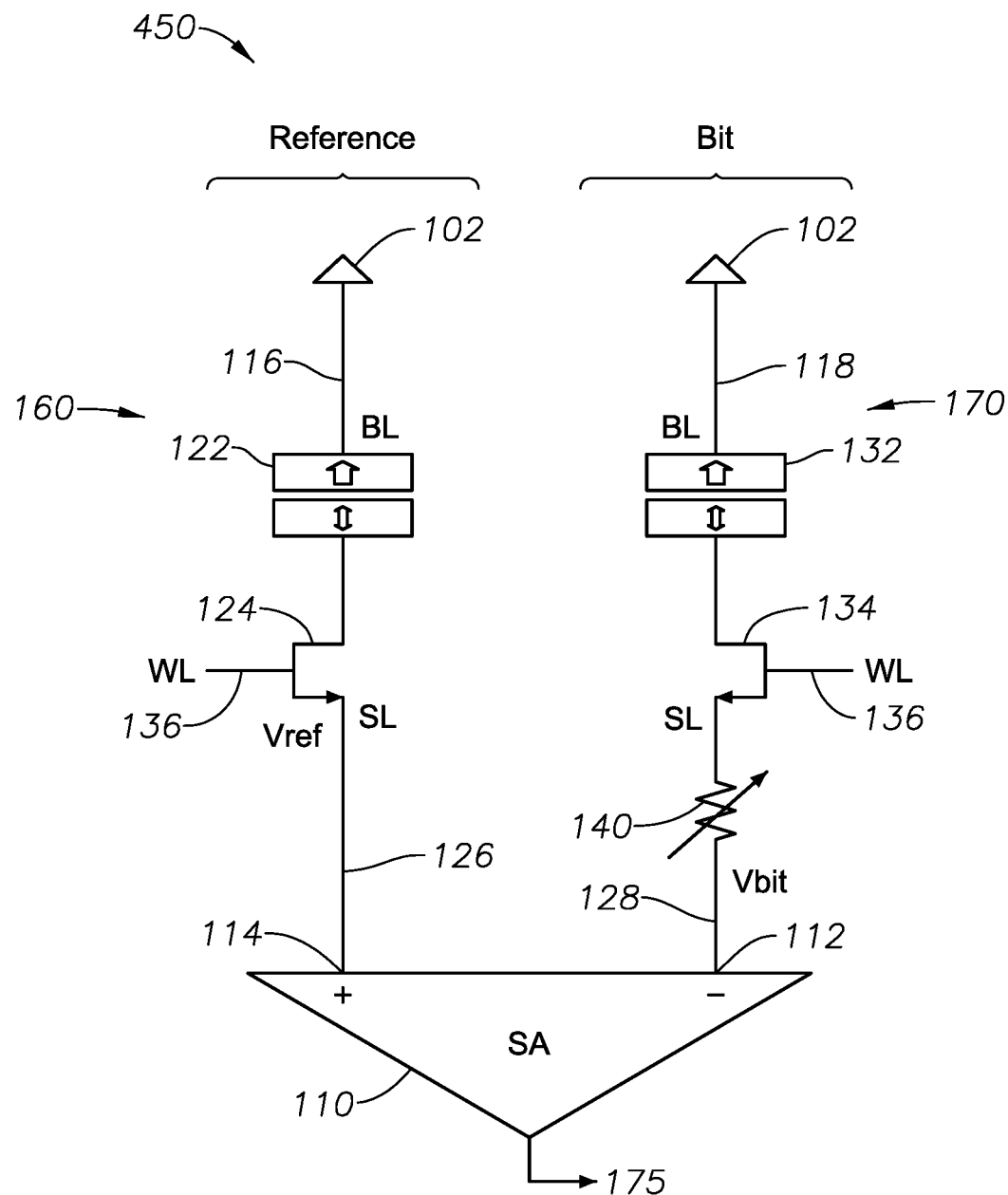

Referring to FIGS. 4A and 4B, in input circuits 400 and 450, respectively, example reference paths 160 and bit paths 170, for performing read operations on the source line (SL), using implementations of the single HRS MTJ (i.e., the first MTJ device 122) reference scheme are shown. As shown in FIGS. 4A-4B, the reference path 160 includes the first MTJ device 122 and the first access device 124 coupled in series from ground 102 to the second input terminal 114 of the sense amplifier 110. The first MTJ device 122 is coupled on the BL 116 between the first access device 124 and ground 102, while the first access device 124 is coupled to the second input terminal 114 of the SL 126. Also, in FIG. 4A, the bit path 170 includes: the CMOS resistor 140 coupled between the second MTJ device 132 (of unknown value being either HRS or LRS) and ground 102 on the BL 118, while the second access device 134 is coupled to the first input terminal 112 on the SL 128. In contrast, in FIG. 4B, the bit path 170 includes the CMOS resistor 140 coupled between the second access device 134 and the first input terminal 112 on the SL 128, while the second MTJ device (of unknown value being either HRS or LRS) is coupled to ground 102 on the BL 118.

In one implementation, referring back to FIG. 1B, a reference path 160 and bit path 170, for performing read operations on the bit line (BL), using implementations of the single HRS MTJ (i.e., the first MTJ device 122) reference scheme is shown. Furthermore, on the reference path 160, the first MTJ device 122 is coupled on the BL 116 between the first input terminal 112 and the first access device 124, while the first access device 124 is further coupled to ground 102 on the SL 126. Also, on the bit path 170, the CMOS resistor 140 is coupled on the BL 118 between the second MTJ device 132 and the second input terminal 114, while the second access device 134 is coupled to ground 102 on the SL 128. In another implementation (not shown), on the reference path 160, the first MTJ device 122 is coupled on the BL 116 between the first input terminal 112 and the first access device 124, while the first access device 124 is further coupled to ground 102 on the SL 126. However, in this implementation, on the bit path 170, the CMOS resistor 140 is coupled on the BL 118 between the second access device 134 and the second input terminal 114, while the second MTJ device 132 (of unknown value being either HRS or LRS) is coupled to ground 102 on the SL 128.

Figure 5:
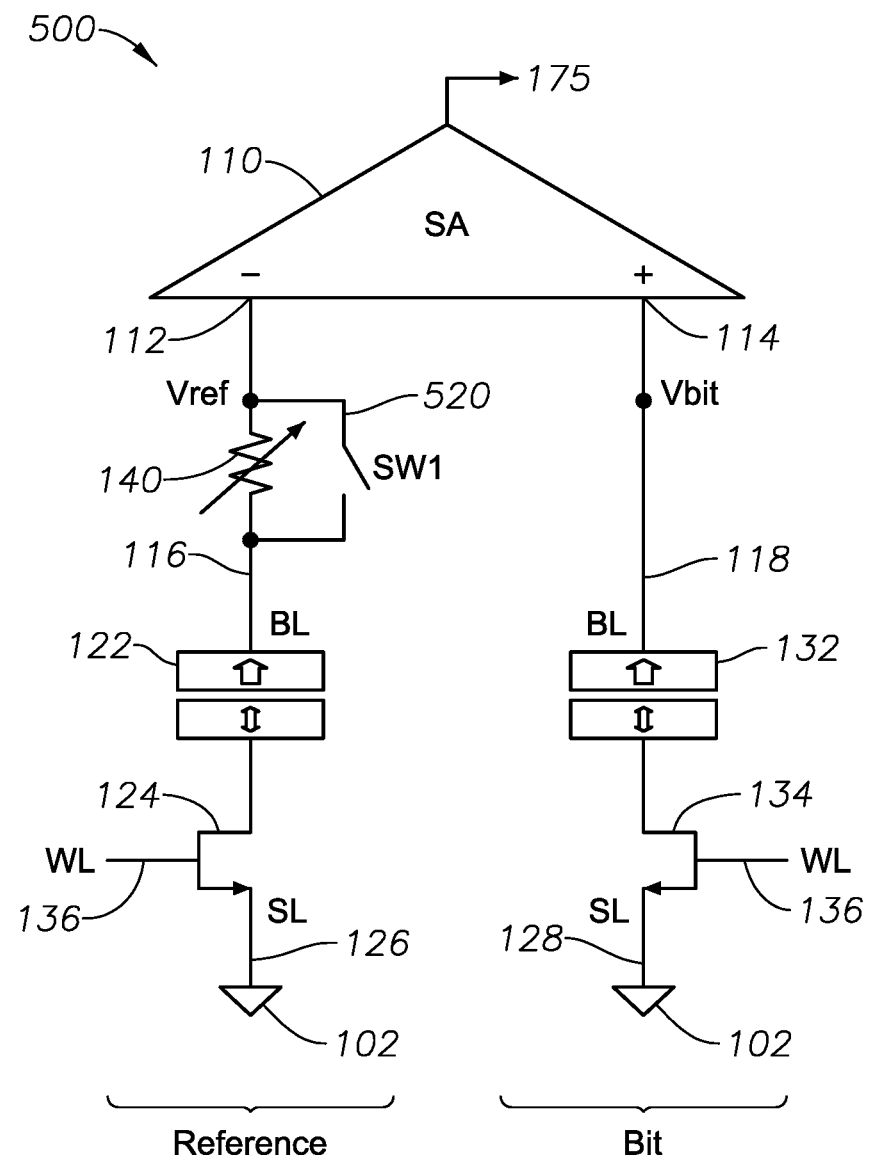
FIG. 5 is an input circuit for a sense amplifier according to certain embodiments.

Referring to FIG. 5, a switch 520 is coupled to the CMOS resistor 140 in the input circuit 500. As illustrated, in one implementation, the switch 520 is coupled to first and second ends of the CMOS resistor 140. Accordingly, in operation, when the switch (SW1) 520 is closed (i.e., switched on) (performed at the beginning of an example read operation), the CMOS resistor 140 is shunted, and the first terminal 112 of the sense amplifier is connected directly to the BL 116. Hence, the sense amplifier 110 may directly provide a correct voltage charge to the BL 116. When the BL 116, is sufficiently charged, the switch can open (i.e., switch off). Advantageously, the switch 520 can accelerate the voltage dynamics on the example BL 116. Moreover, in various alternative implementations (e.g., similar to those as described with reference to FIGS. 1-4 and 6-11A-B), the switch 520 can be coupled likewise to the CMOS resistor 140 as additional circuit designs for each of the implementations described herein. In certain examples, the switch 520 can be coupled to first and second ends of the CMOS resistor 140 when the CMOS resistor 140 may be coupled to either the reference path 160 or the bit path 170, The switch 520 can also be coupled to first and second ends of the CMOS resistor 140 when the CMOS resistor 140 may be coupled to either the SL 126, 128 or BL 116, 118.

Figure 6A:
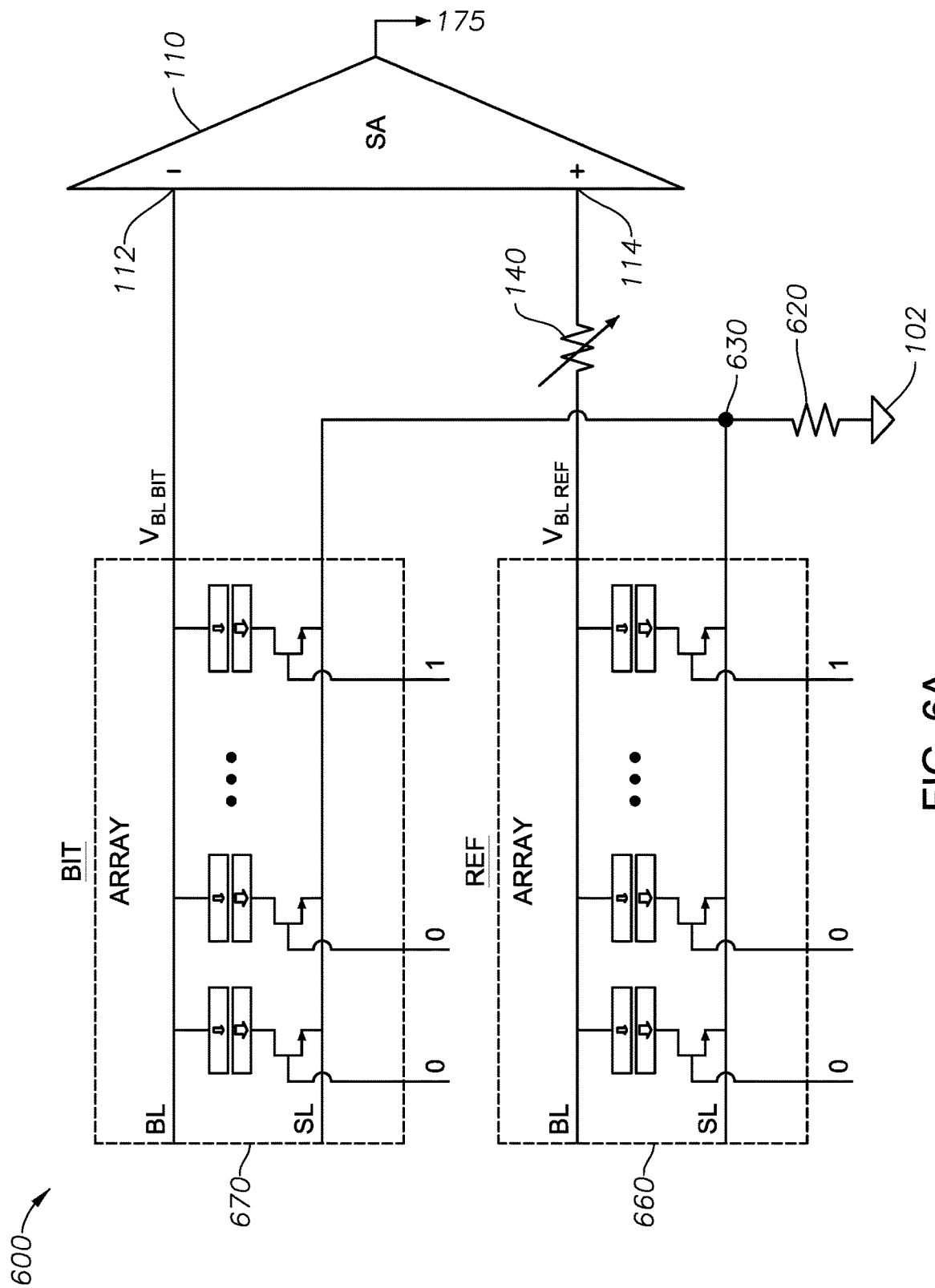
FIGS. 6A-6B are input circuits for a sense amplifier according to certain embodiments.
Figure 6B:
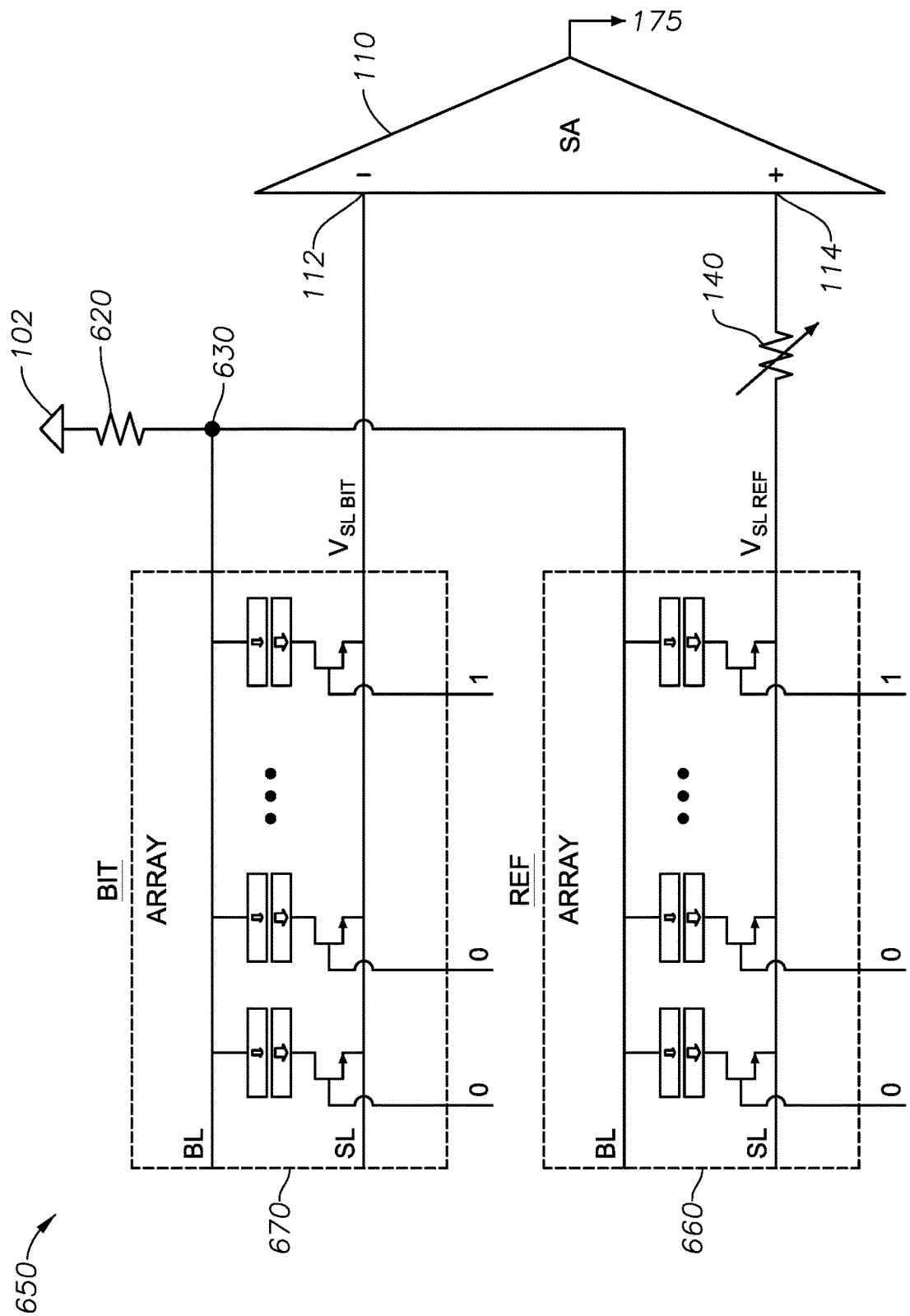

Referring to FIGS. 6A-B, in each of the input circuits 600 and 650, respectively, a voltage drop element 620 is coupled to the plurality of reference paths 660 (i.e., a first memory array, a reference memory array) (e.g., two or more reference paths 160) and the plurality of bit paths 670 (i.e., a second memory array, a bit memory array) (e.g., two or more bit paths 170). Hence, in certain implementations, the first memory array 660 may include a respective plurality of reference paths 660, while the second memory array may include a respective plurality of bit paths 670. The respective plurality of bit and reference paths 660, 670 may be implemented with any of the circuit implementations as described in above paragraphs.

As illustrated in the input circuits 600 and 650, the voltage drop element 620 is coupled to a node 630 combining the plurality of reference paths 660 and the plurality of bit paths 670 and the ground 102. In certain operations, with reference to FIG. 6A, the bit line voltage for the bit path ($V_{BL\_BIT}$) and the bit line voltage of the reference path ($V_{BL\_REF}$) may have different values (e.g., at high temperatures), thus leading to a different leakage on each of the reference paths 160 in comparison to the leakage on each of the bit paths 170. In certain operations, with reference to FIG. 6B, the source line voltage for the bit path ($V_{SL\_BIT}$) and the source line voltage of the reference path ($V_{SL\_REF}$) may have different values (e.g., at high temperatures), thus leading to a different leakage on each of the reference paths 160 in comparison to the leakage on each of the bit paths 170. This leakage difference may lead to systematic voltage offset. The voltage drop element 620 can be configured to mitigate leakage and systematic voltage offset. As shown in input circuit 600 of FIG. 6A, when performing a read operation from the BL, the voltage drop element is 620 is coupled to the source lines of each of the reference paths 160 and each of the bit paths 170. As shown in input circuit 650 of FIG. 6B, when performing a read operation from the SL, the voltage drop element 620 is coupled to the bit lines of each of the reference paths 160 and the bit paths 170.

In various implementations of the input circuits 600 and 650, the voltage drop element 620 can either be a resistor, a transistor, or a voltage generator. By including the voltage drop element 620, a series impedance is added on the current paths leading to a voltage raise. The voltage raise is a negative gate-to-source voltage (Vgs) for each of the plurality of access devices (i.e., NMOS access devices) (e.g., access devices 124, 134). Further in operation, the negative Vgs may exponentially reduce the leakage of all non-accessed bit-cells and thus, making the leakage difference between the plurality of bit paths 6700 and the plurality of reference paths 660 negligible. In certain implementations, the series impedance may be "common-mode" such that it would not add offset to a read operation.

Figure 7:
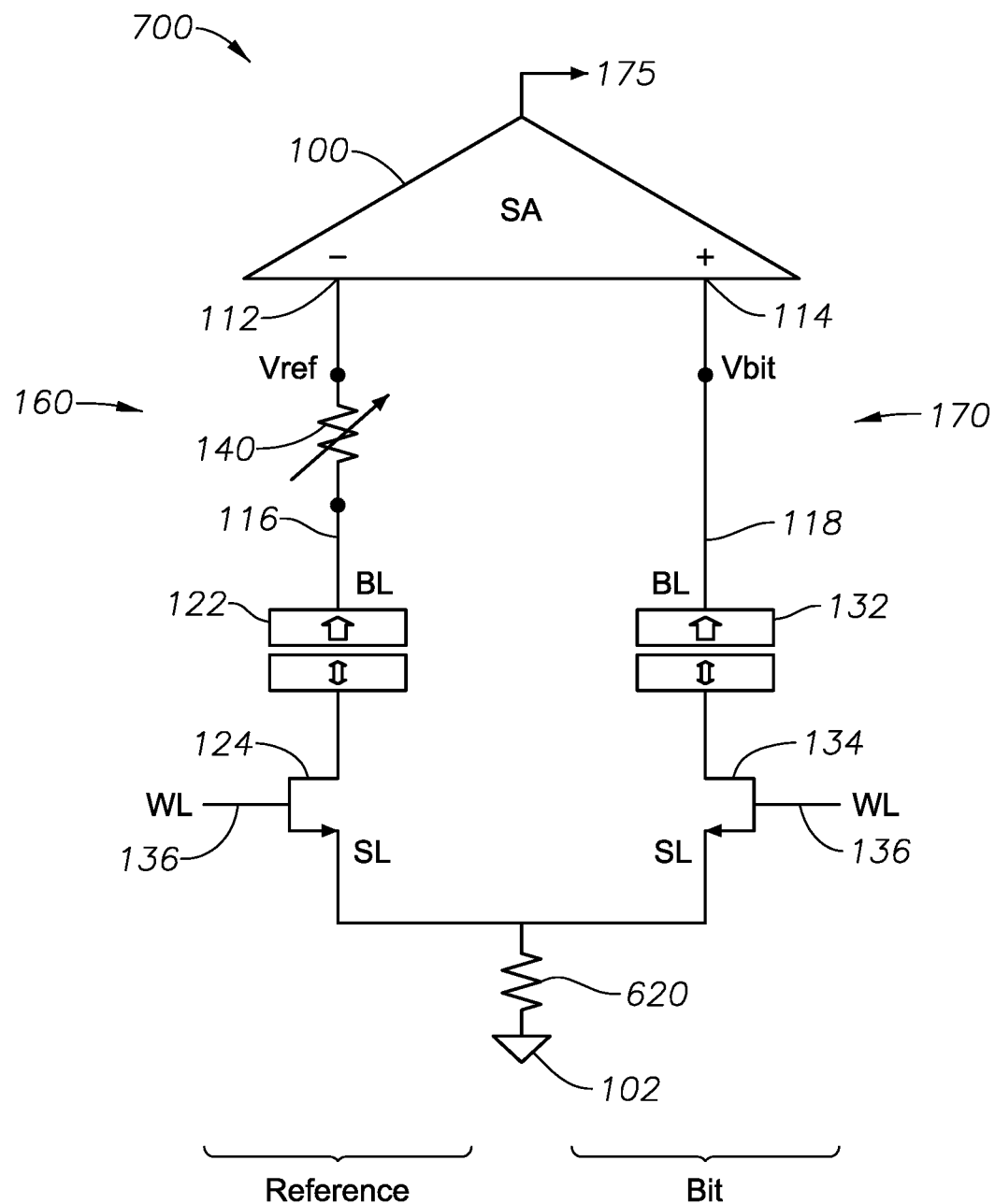
FIG. 7 is another input circuit for a sense amplifier according to certain embodiments.

Referring to FIG. 7, in input circuit 700, the voltage drop element 620 is shown as an added circuit element to the example implementation of the input circuit 100. As depicted, FIG. 7 illustrates the voltage drop element 620 as coupled to a reference path 160 and a bit path 170. FIG. 7 may also represent a simplified input circuit diagram of FIG. 6 where the reference path 160 is a representative reference path 160 of the plurality of reference paths 660, and the bit path 170 is a representative bit path 170 of the plurality of bit path 670. In addition to features as described above with reference to FIG. 1A, when performing a read operation from the BL, the voltage drop element 620 is coupled to the SLs of the respective reference and bit path 160, 170 and ground 102. In another implementation (not shown), when performing a read operation from the SL, the voltage drop element 620 is coupled to the BLs of the respective reference and bit path 160, 170 and ground 102.

In certain implementations as described with reference to FIGS. 8A-8B, 9A-9B, and 11A-B, when reference elements are "shared" between two sense amplifiers, reference "dithering" (i.e., randomization) can be performed. That is, by sharing different references of two input circuit arrangements with two sense amplifiers, respectively, in two different phases (e.g., a sampling phase of the sense amplifiers and an amplification phase of the sense amplifiers), the references are averaged, and thus, lead to better read margin results.

Figure 8A:
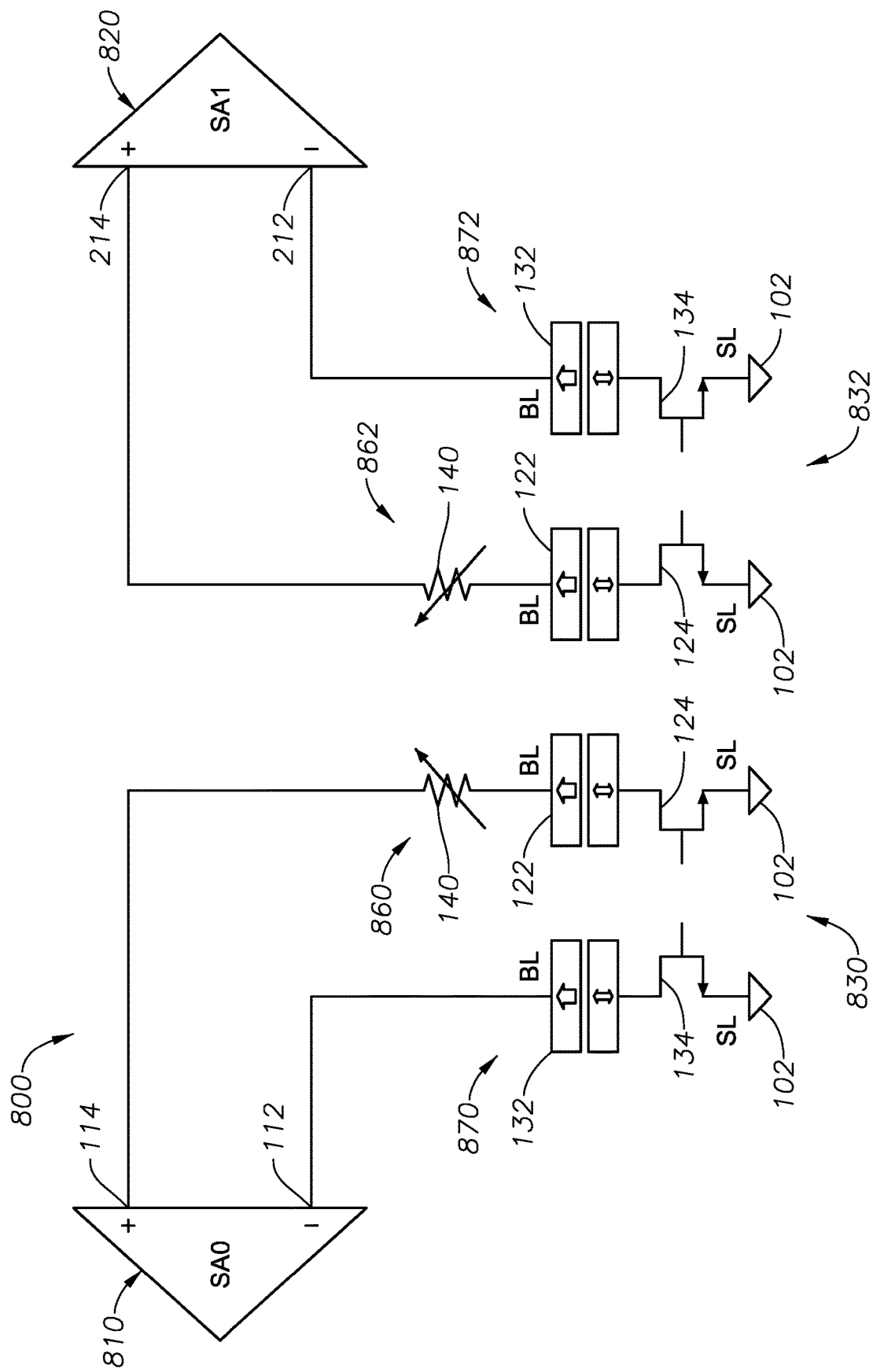
FIGS. 8A-8B are input circuits for sense amplifiers according to certain embodiments.
Figure 8B:
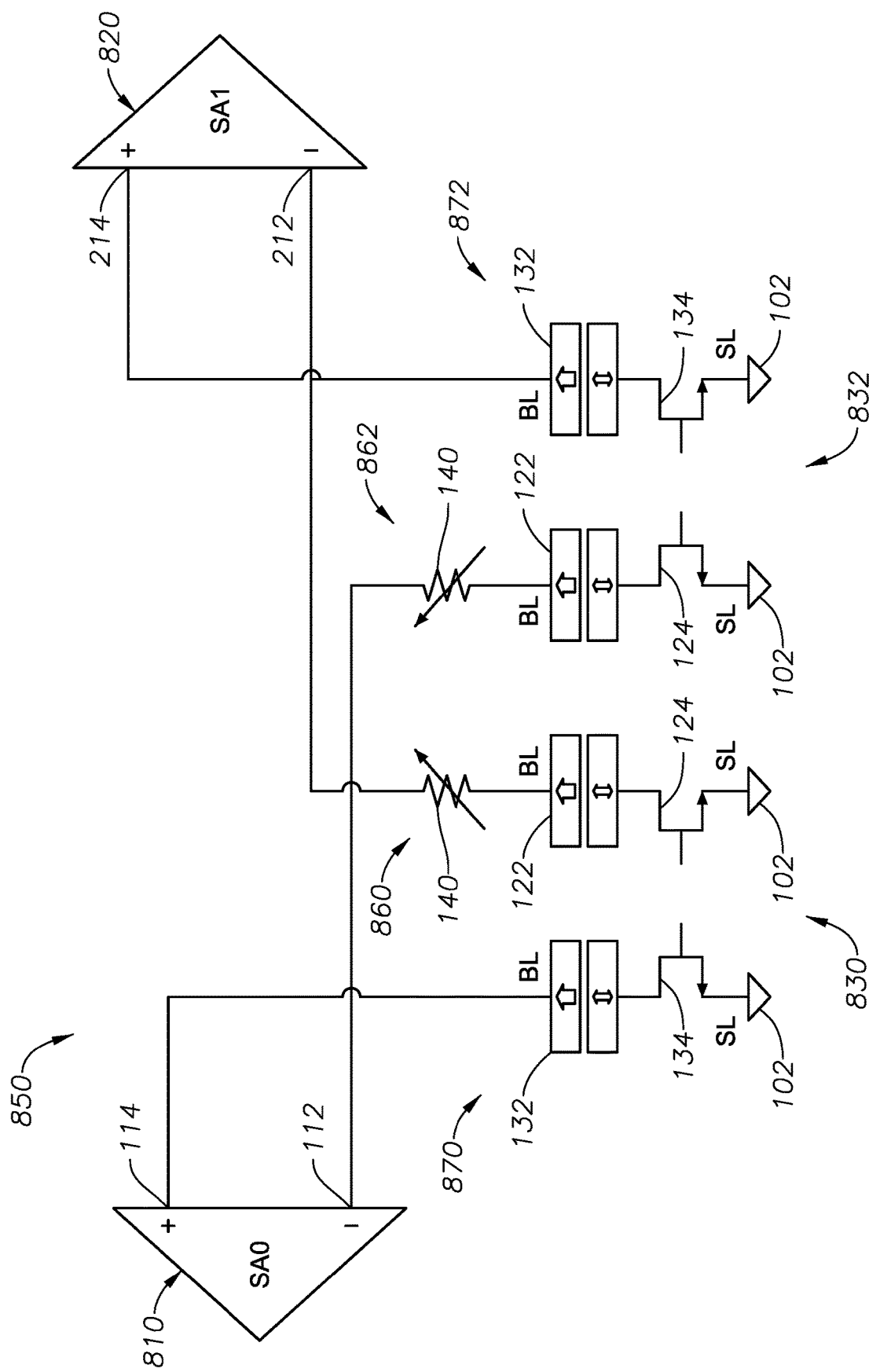

Referring to FIGS. 8A-8B, reference paths (i.e., reference memory paths, reference memory elements) 860, 862 and bit paths (i.e., bit memory paths, bit memory elements) 870, 872 are shown as first and second circuit input arrangements 830, 832 that are coupled to first and second sense amplifiers 810 (SA0) and 820 (SA1) (i.e., first and second systems). As depicted in two phases (i.e., two stages), a sampling phase 800 (e.g., FIG. 8A (or in another circuit implementation, FIG. 8B depending on the internal working of the sense amplifier)) and an amplification phase 850 (e.g., FIG. 8B (or in another circuit implementation, FIG. 8A depending on the internal working of the sense amplifier)), the sense amplifiers 810 (SA1) and 820 (SA2) may be configured to determine (i.e., to read) the logical state (whether an HRS or an LRS) of the respective MTJs in the bit paths 870, 872. As illustrated in FIGS. 8A-8B, each of the reference paths 860, 862 includes a first MTJ device 122, CMOS resistor 140, as well as the first access device 124. Also, each of the bit paths 870, 872 includes a second MTJ device 132 and a second access device 134.

In one example operation, outside the example first and second systems 810 and 820, for the sampling phase 800, the first reference memory element 860 (of the first input circuit 830) may be coupled to the second input terminal 114 (e.g., plus port). Also, the first bit that is desired to be read, the first bit memory element 870 (of the first input circuit 830), may be coupled to the first input terminal 112 (e.g., minus port) of the system 810 (SA0). Likewise, the second reference memory element 862 (of the second input circuit 832) may be coupled to the second input terminal 214 (e.g. plus port), and the second bit that is desired to be read, the second bit memory element 872 (of the second input circuit 832), may be coupled to the first input terminal 212 (e.g., minus port) of the system 820 (SA1). Conversely, for the amplification phase 850, the first bit memory element 870 may be coupled to the second input terminal 114 (e.g., plus port) and the second reference memory element 862 may be coupled to the first input terminal 112 (e.g., minus port) of the system 810 (SA0). Likewise, the first reference memory element 860 may be coupled to the first input terminal 212 (e.g., minus port) and the second bit memory element 872 may be coupled to the second input terminal 214 (e.g., plus port) of the system 820 (SA1). Hence, in the amplification phase, a comparison can be made between the desired bits to be read, i.e., between each of the first and second bit memory elements 870, 872 and the reference memory elements 860, 862. In various implementations described herein, the input circuits 830 and 832 may be any of input circuits as described herein where the first MTJ is in an LRS, such as in FIGS. 1A, 3A, 3B, 5, 6A-6B, and 7.

Figure 9A:
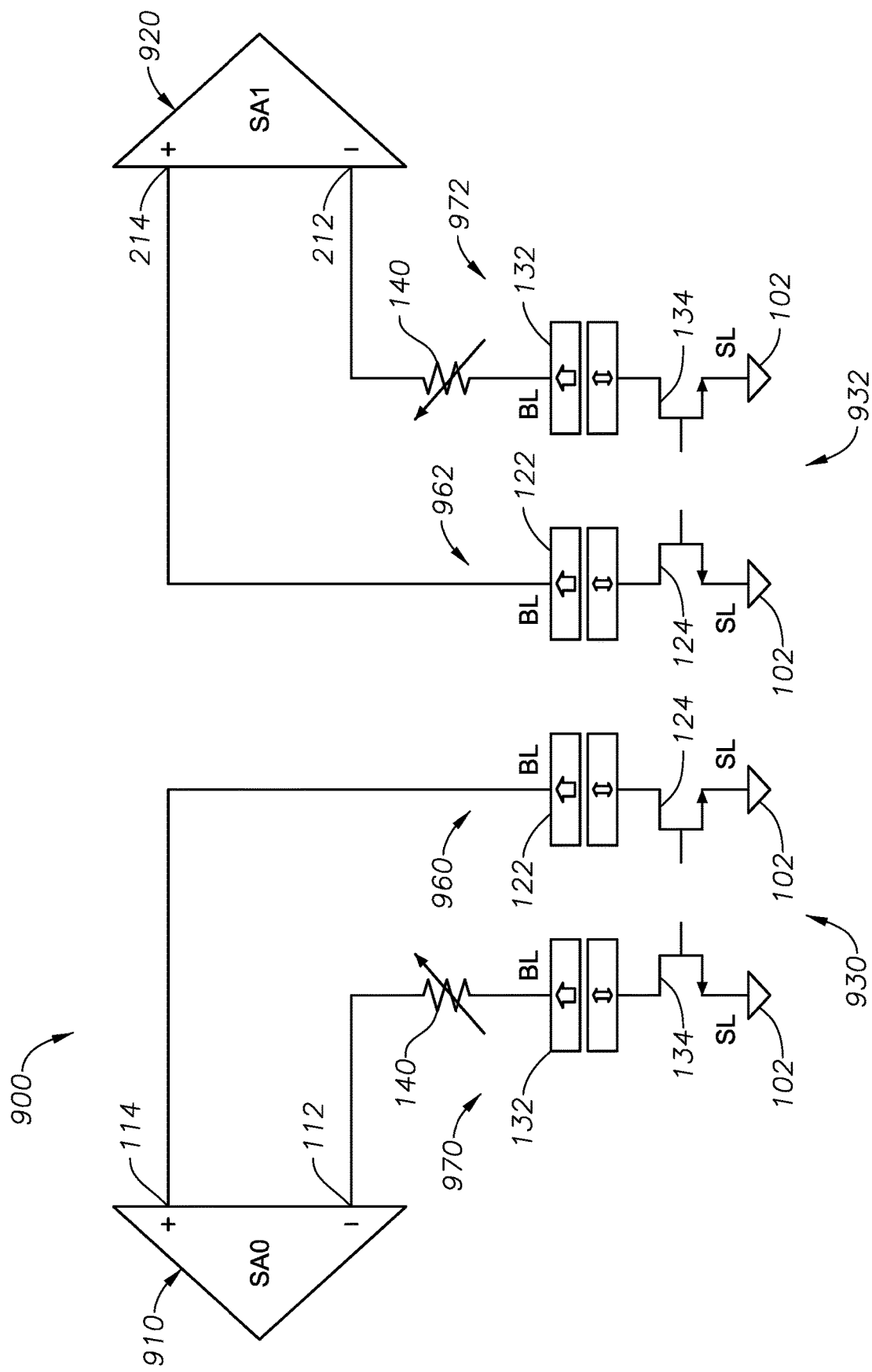
FIGS. 9A-9B are input circuits for sense amplifiers according to certain embodiments.
Figure 9B:
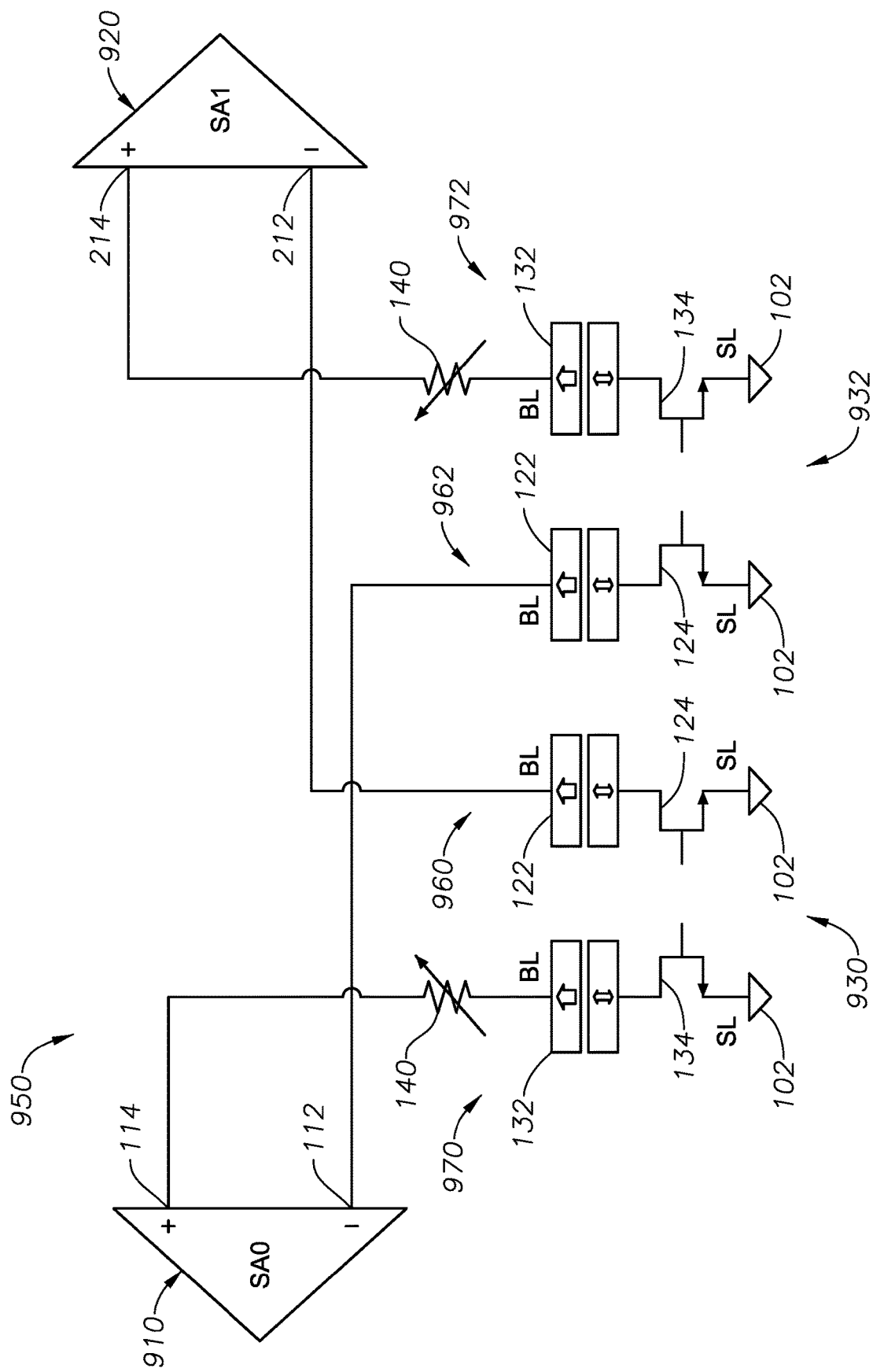

Referring to FIGS. 9A-9B, reference paths (i.e., reference memory paths, reference memory elements) 960, 962 and bit paths (i.e., bit memory paths, bit memory elements) 970, 972 are shown as first and second circuit input arrangements 930, 932 that are coupled to first and second sense amplifiers 910 (SA0) and 920 (SA1) (i.e., first and second systems). As depicted in two phases (i.e., two stages), a sampling phase 900 (e.g., FIG. 9A (or in another circuit implementation, FIG. 9B depending on the on the internal working of the sense amplifier)) and an amplification phase 950 (e.g., FIG. 9B (or in another circuit implementation, FIG. 9A depending on the internal working of the sense amplifier)), the sense amplifiers 910 (SA1) and 920 (SA2) may be configured to determine (i.e., to read) the logical state (whether an HRS or an LRS) of the respective MTJs in the bit paths 970, 972. As illustrated, each of the reference paths 960, 962 includes a first MTJ device 122 and the first access device 124. Also, each of the bit paths 970, 972 includes a second MTJ device 132, a second access device 134, as well as a CMOS resistor 140.

In one example operation, outside the example first and second systems 910 and 920, for the sampling phase 900, the first reference memory element 960 (of the first input circuit 930) may be coupled to the second input terminal 114 (e.g., plus port). Also, the first bit that is desired to be read, the first bit memory element 970 (of the first input circuit 930), may be coupled to the first input terminal 112 (e.g., minus port) of the system 910 (SA0). Likewise, the second reference memory element 962 (of the second input circuit 932) may be coupled to the second input terminal 214 (e.g. plus port), and the second bit that is desired to be read, the second bit memory element 972 (of the second input circuit 932), may be coupled to the first input terminal 212 (e.g., minus port) of the system 920 (SA1). Conversely, for the amplification phase 950, the first bit memory element 970 may be coupled to the second input terminal 114 (e.g., plus port) and the second reference memory element 962 may be coupled to the first input terminal 112 (e.g., minus port) of the system 910 (SA0). Likewise, the first reference memory element 960 may be coupled to the first input terminal 212 (e.g., minus port) and the second bit memory element 972 may be coupled to the second input terminal 214 (e.g., plus port) of the system 920 (SA1). Hence, in the amplification phase 950, a comparison can be made between the desired bits to be read, i.e., between each of the first and second bit memory elements 970, 972 and the first and second reference memory elements 960, 962. In various implementations described herein, the input circuits 930 and 932 may be any of input circuits as described herein where the first MTJ is in an HRS, such as in FIGS. 1B, 4A, and 4B.

Figure 10A:
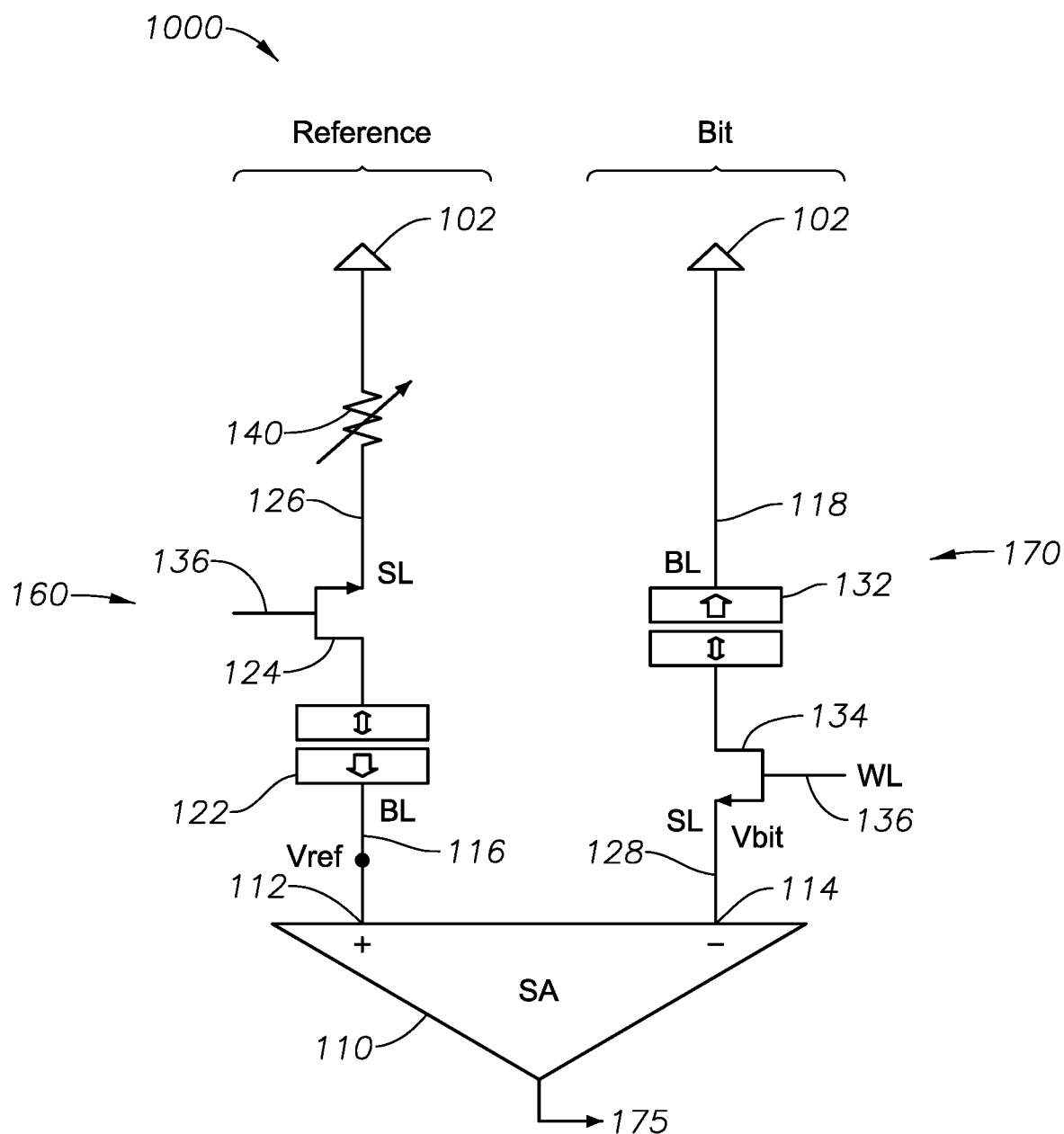
FIGS. 10A-10B are input circuits for sense amplifiers according to certain embodiments.
Figure 10B:
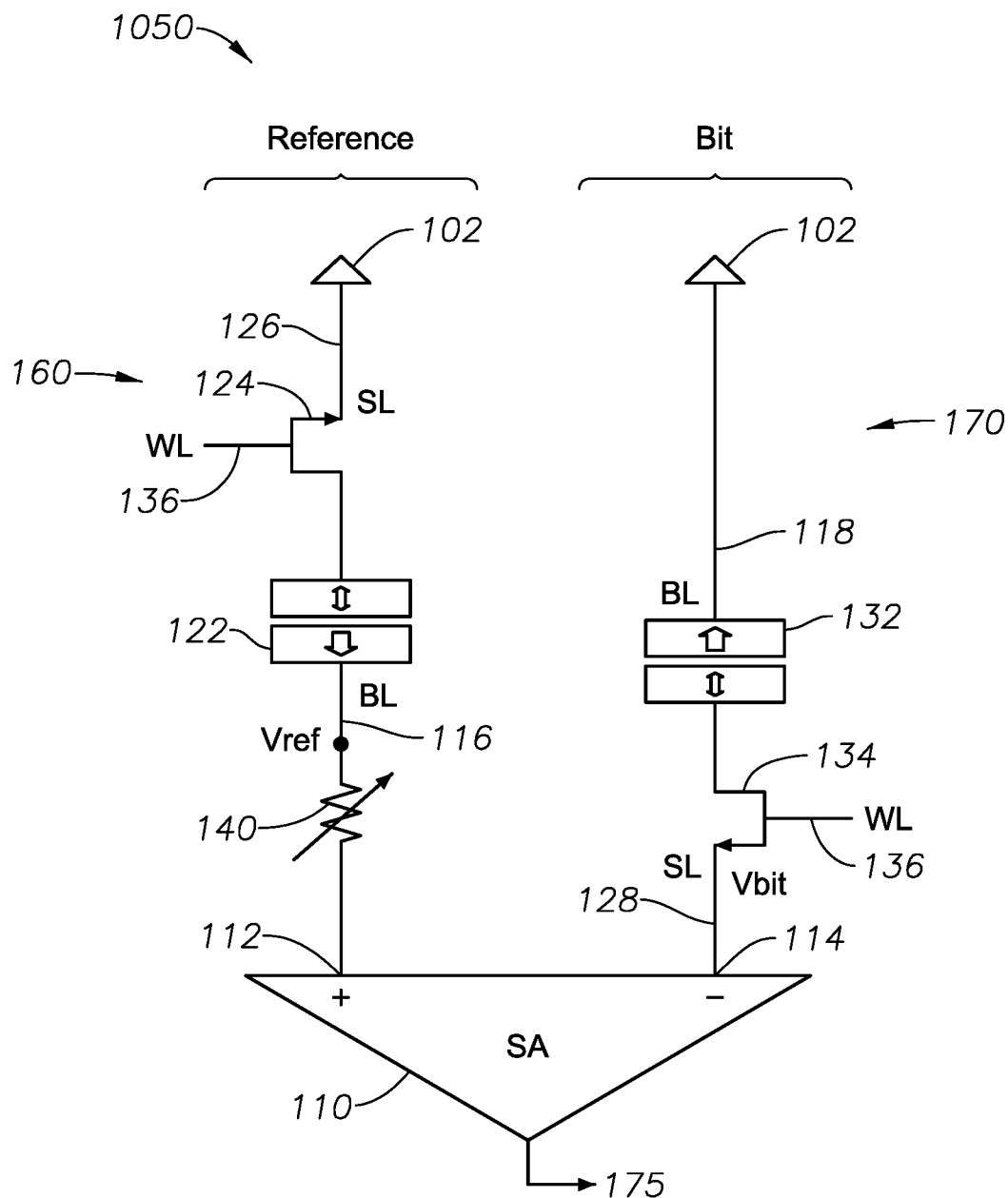

Referring to FIGS. 10A and 10B, in input circuits 1000 and 1050, respectively, example reference paths 160 and bit paths 170, for performing read operations on the bit line (BL), using implementations of the single LRS MTJ (i.e., the first MTJ device 122) reference scheme are shown. As shown in FIGS. 10A-10B, each of the reference paths 160 include: the CMOS resistor 140, the first access device 124, and the first MTJ device 122 coupled in series from ground 102 to the first input terminal 112 of the sense amplifier 110.

As illustrated in FIG. 10A, the first MTJ device 122 is coupled on the BL 116 between the first access device 124 and the first input terminal 112, while the CMOS resistor 140 is coupled between the first access device 124 and ground 102 on the SL 126. As shown in FIG. 10A, when performing a read operation from the BL 116, the reference path 160 includes a direct connection between the first MTJ device 122 and the sense amplifier 110.

Advantageously, such a direct connection would allow for disturbance-free reference path read operations. Also, in FIG. 10A, the bit path 170 includes the second MTJ device 132 (of unknown value being either HRS or LRS) coupled between the access device 134 and ground 102 on the BL 118, while the access device 134 is also coupled to the second input terminal 114 on the SL 128.

In another implementation, in FIG. 10B, the reference path 160 includes the first access device 124, the first MTJ device 122, and the CMOS resistor 140 coupled in series from ground 102 to the first input terminal 112. As illustrated, the first MTJ device 122 and the CMOS resistor 140 are coupled on the BL 116 between the first access device 124 and the first input terminal 112, while the first access device 124 is also coupled to ground 102 on the SL 126. Also, in FIG. 10B, the bit path 170 includes the second MTJ device 132 (of unknown value being either HRS or LRS) coupled between the access device 134 and ground 102 on the BL 118, while the access device 134 is also coupled to the second input terminal 114 on the SL 128.

Figure 11A:
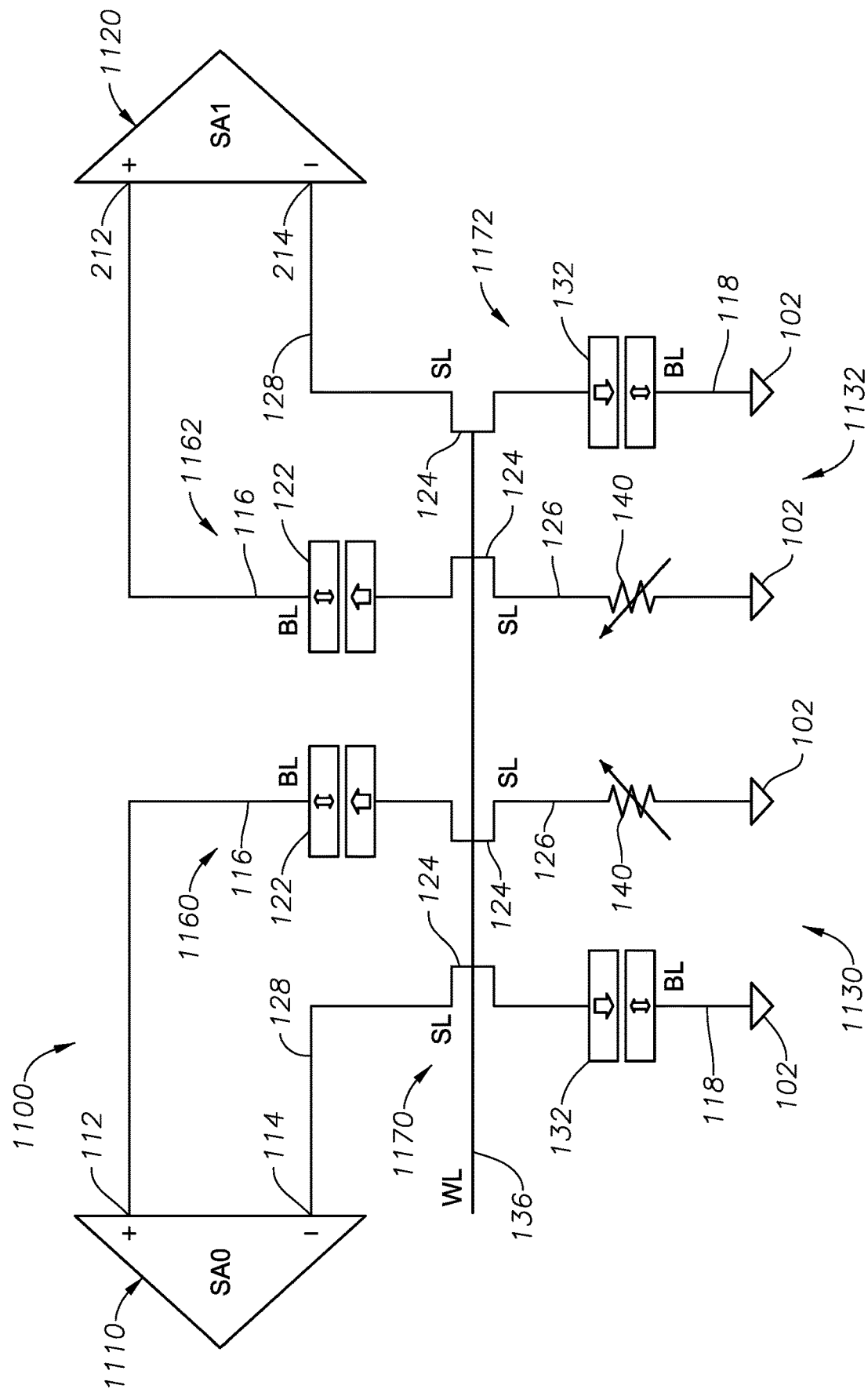
FIGS. 11A-11B are input circuits for sense amplifiers according to certain embodiments.
Figure 11B:
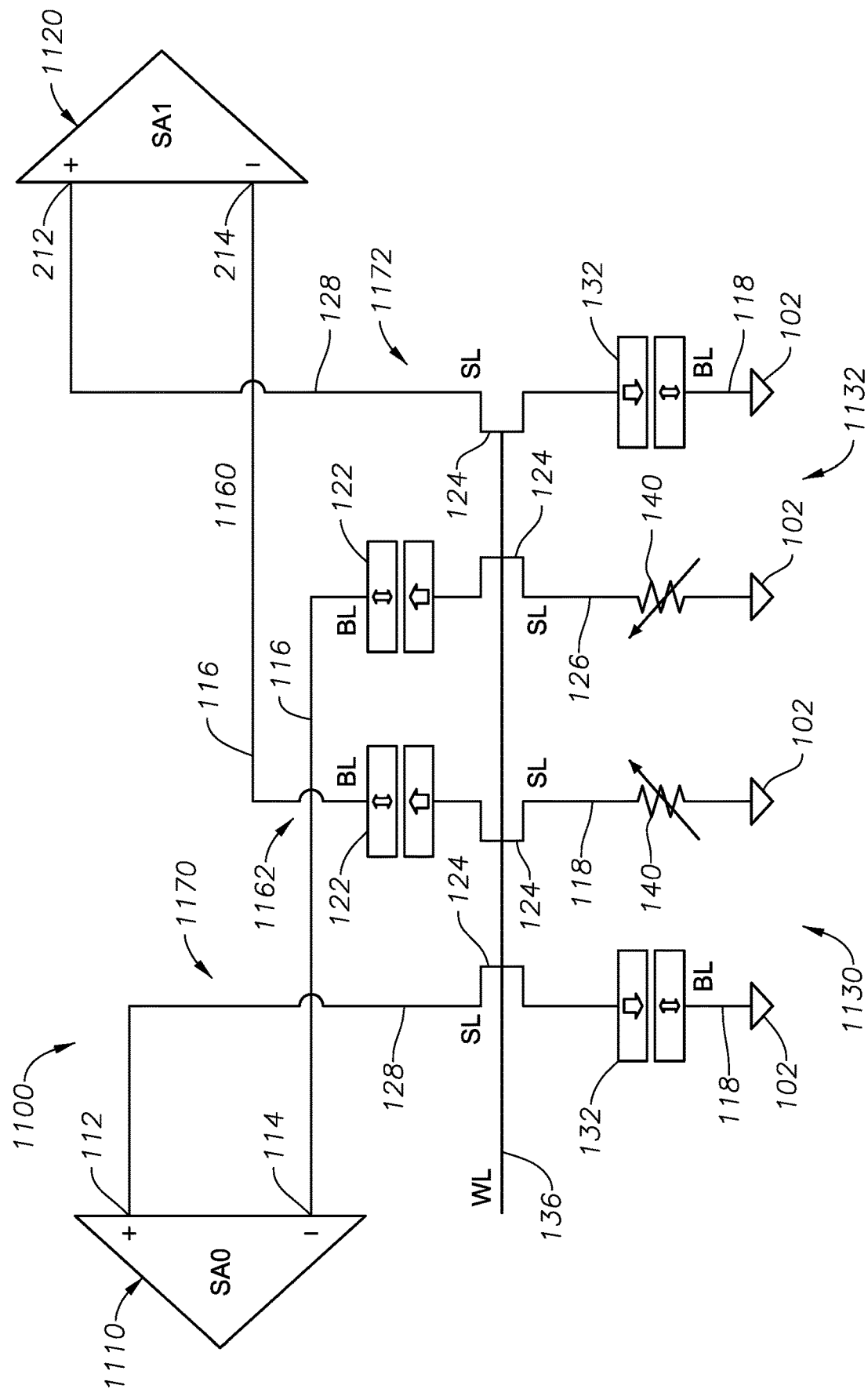

Referring to FIGS. 11A-11B, reference paths (i.e., reference memory paths, reference memory elements) 1160, 1162 and bit paths (i.e., bit memory paths, bit memory elements) 1170, 1172 are shown as first and second circuit input arrangements 1130, 1132 that are coupled to first and second sense amplifiers 1110 (SA0) and 1120 (SA1) (i.e., first and second systems). As depicted in two phases (i.e., two stages), a sampling phase 1100 (e.g., FIG. 11A (or in another circuit implementation, FIG. 11B depending on the on the internal working of the sense amplifier)) and an amplification phase 1150 (e.g., FIG. 11B (or in another circuit implementation, FIG. 11A depending on the internal working of the sense amplifier)), the sense amplifiers 1110 (SA1) and 1120 (SA2) may be configured to determine (i.e., to read) the logical state (whether an HRS or an LRS) of the respective MTJs in the bit paths 1170, 1172. As illustrated in FIGS. 11A-B, each of the reference paths 1160, 1162 includes a first MTJ device 122, a first access device 124 as well as a CMOS resistor 140. Also, each of the bit paths 1170, 1172 includes a second MTJ device 132 and a second access device 134.

Notably, similar to the coupling as shown FIGS. 10A-10B, in FIG. 11A, both of the reference paths 1160 and 1162 include the CMOS resistor 140, the first access device 124, and the first MTJ device 122 coupled in series from ground 102 to the respective first input terminal of the sense amplifier (e.g., to the respective first input terminal 112 of the sense amplifier 1110 and to the the respective first input terminal 212 of the sense amplifier 1120). As illustrated, for each of the reference paths 1160 and 1162, the first MTJ device 122 is coupled on the BL 116 between the first access device 124 and the first input terminal 112, while the CMOS resistor 140 is coupled between the first access device 124 and ground 102 on the SL 126. Also, in FIG. 11A, both of the bit paths 1170 and 1172 include the second MTJ device 132 (of unknown value being either HRS or LRS) coupled between the access device 134 and ground 102 on the BL 118, while the access device 134 is coupled to the respective second input terminal of the sense amplifier on the SL 128 (e.g., to the respective second input terminal 114 of the sense amplifier 1110 and to the the respective second input terminal 214 of the sense amplifier 1120).

In one example operation, outside the example first and second systems 1110 and 1120, for the sampling phase 1100, the first reference memory element 1160 (of the first input circuit 1130) may be coupled to the first input terminal 112 (e.g., plus port) of the system 1110 (SA0). Also, the first bit that is desired to be read, the first bit memory element 1170 (of the first input circuit 1130), may be coupled to the second input terminal 114 (e.g., minus port) of the system 1110 (SA0). Likewise, the second reference memory element 1162 (of the second input circuit 1132) may be coupled to the first input terminal 212 (e.g. plus port) of the system 1120 (SA1), and the second bit that is desired to be read, the second bit memory element 1172 (of the second input circuit 1132), may be coupled to the second input terminal 214 (e.g., minus port) of the system 1120 (SA1). Conversely, for the amplification phase 1150, the first bit memory element 1170 may be coupled to the first input terminal 112 (e.g., plus port) and the second reference memory element 1162 may be coupled to the second input terminal 114 (e.g., minus port) of the system 1110 (SA0). Likewise, the first reference memory element 1160 may be coupled to the second input terminal 214 (e.g., minus port) and the second bit memory element 1172 may be coupled to the first input terminal 212 (e.g., plus port) of the system 1120 (SA1). Hence, in the amplification phase 1150, a comparison can be made between the desired bits to be read, i.e., between each of the first and second bit memory elements 1170, 1172 and the first and second reference memory elements 1160, 1162. In various implementations described herein, the input circuits 1130 and 1132 may be any of input circuits as described herein where the first MTJ is in an LRS, for example, such as in FIGS. 10 A-B.

Advantageously, in one example, as shown in FIGS. 10A-B-11A-B, by reading the reference paths from the BL, read disturbance may be avoided on the reference paths. For instance, as the reference MTJ may be in LRS (e.g., a P state) and a read operation from the BL would include the AP state to P state write path, during the read operation, the LRS MTJ would not be disturbed.

For each of the circuit implementations as described heren with reference to FIGS. 1-11, the reference path(s) may be coupled to the minus port (minus input terminal) of the sense amplifier, while the bit path(s) may be coupled to the plus port (plus input terminal). Also, in alternative circuit implementations, the reference path(s) may be coupled to the plus port (plus input terminal) of the sense amplifier, while the bit path(s) may be coupled to the minus port (minus input terminal). Accordinly, in each of circuit implementations as discussed herein, the minus input terminal may be either the first input terminal or the second input terminal, and the plus input terminal may be either second input terminal or the first input terminal, respectively.

Although one or more of FIGS. 1A-11B may illustrate systems and apparatuses according to the teachings of the disclosure, the disclosure is not limited to these illustrated systems, apparatuses, or methods. One or more functions or components of any of FIGS. 1A-11B as illustrated or described herein may be combined with one or more other portions of another of FIGS. 1A-11B. Accordingly, no single implementation described herein should be construed as limiting and implementations of the disclosure may be suitably combined without departing form the teachings of the disclosure.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. An input circuit for a sense amplifier comprising:
a reference path comprising a first magnetic tunnel junction (MTJ) device and a first access device, wherein the reference path is coupled to the sense amplifier via a first input terminal;
a bit path comprising a second MTJ device and a second access device, wherein the bit path is coupled to the sense amplifier via a second input terminal; and a complementary metal oxide semiconductor (CMOS) resistor coupled to one of the reference path and the bit path, wherein when the CMOS resistor is coupled to the bit path, the CMOS resistor is configured as a resistive offset of the second MTJ such that an impedance of the bit path is greater than or less than a high resistive state (HRS).

2. The input circuit of claim 1, wherein each of the reference path and the bit path comprises a sole MTJ device.

3. The input circuit of claim 1, wherein the impedance of the bit path is greater than or less than the impedance of the reference path.

4. The input circuit of claim 1, wherein when the CMOS resistor is coupled to the reference path, the CMOS resistor is configured as a resistive offset of the first MTJ device such that an impedance of the reference path is between the low resistive state and the high resistive state.

5. The input circuit of claim 1, wherein the first MTJ device corresponds to the high resistive state, wherein an impedance of the reference path corresponds to a high resistive state, and wherein an impedance of the bit path is greater than or less than the high resistive state.

6. The input circuit of claim 1, wherein the CMOS resistor comprises a transistor or a PDK resistor.

7. The input circuit of claim 1, wherein the CMOS resistor is coupled to the first access device and the first MTJ device in a series arrangement from the first input terminal and ground, or the CMOS resistor is coupled to the second access device and the second MTJ device in a series arrangement from the second input terminal and ground.

8. The input circuit of claim 1, wherein each of the reference path and the bit path further comprises a bit line multiplexer, a bit line parasitic resistance, a source line multiplexer, a source line parasitic resistance and a read pull-down device.

9. The input circuit of claim 1, further comprising a switch coupled to first and second ends of the CMOS resistor.

10. The input circuit of claim 1, wherein a read operation is configured to be performed from a bit line or a source line.

11. The input circuit of claim 10, wherein if the read operation is performed on the bit line and the first MTJ device corresponds to the low resistive state, it is determined that the CMOS resistor is coupled on the reference path between the first MTJ device and the first input terminal of the sense amplifier, or that the CMOS resistor is coupled between the first access device and ground.

12. The input circuit of claim 10, wherein if the read operation is performed on the source line and the first MTJ device corresponds to the low resistive state, it is determined that the CMOS resistor is coupled on the reference path between the first MTJ device and ground, or that the CMOS resistor is coupled between the first access device and the first terminal of the sense amplifier.

13. The input circuit of claim 10,
wherein if the read operation is performed on the bit line and the first MTJ device corresponds to the high resistive state, it is determined that the CMOS resistor is coupled on the bit path between the second MTJ device and ground, or that the CMOS resistor is coupled between the second access device and the second terminal of the sense amplifier; or
wherein if the read operation is performed on the source line and the first MTJ device corresponds to the high resistive state, it is determined that the CMOS resistor is coupled on the bit path between the second MTJ device and the second input terminal of the sense amplifier, or that the CMOS resistor is coupled between the second MTJ device and ground.

14. An input circuit for a sense amplifier comprising:
a reference path comprising a first magnetic tunnel junction (MTJ) device and a first access device, wherein the reference path is coupled to the sense amplifier via a first input terminal;
a bit path comprising a second MTJ device and a second access device, wherein the bit path is coupled to the sense amplifier via a second input terminal; and
a complementary metal oxide semiconductor (CMOS) resistor coupled to one of the reference path and the bit path, further comprising:
a voltage drop element configured to mitigate leakage and systematic voltage offset, wherein the voltage drop element is coupled between a node combining the reference path and the bit path and ground, and wherein the voltage drop element comprises one of a resistor, a transistor, and a voltage generator.

15. The input circuit of claim 14, further comprising two or more reference paths and two or more bit paths, wherein the voltage drop element is coupled between a node combining the two or more reference paths and the two or more bit paths and ground.

16. An input circuit for a sense amplifier comprising:
a reference path comprising a first magnetic tunnel junction (MTJ) device and a first access device, wherein the reference path is coupled to the sense amplifier via a first input terminal;
a bit path comprising a second MTJ device and a second access device, wherein the bit path is coupled to the sense amplifier via a second input terminal; and
a complementary metal oxide semiconductor (CMOS) resistor coupled to one of the reference path and the bit path,
wherein the input circuit for the sense amplifier is integrated into a memory comprising two or more input circuits,
wherein a first input circuit of the two or more input circuits is coupled to a first sense amplifier and a second input circuit of the two or more input circuits is coupled to a second sense amplifier, and wherein
during a sampling phase, a bit path and a reference path of the first input circuit are coupled to respective first and second input terminals of the first sense amplifier, and a bit path and a reference path of the second input circuit are coupled to respective first and second input terminals of the second sense amplifier, and
during an amplification phase, the reference path of the second input circuit and the bit path of the first input circuit are coupled to the respective first and second input terminals of the first sense amplifier and the reference path of the first input circuit and the bit path of the second input circuit are coupled to the respective first and second input terminals of the second sense amplifier.

17. An input circuit for a sense amplifier comprising:
a reference element comprising a first magnetic tunnel junction (MTJ) device and a first access device, wherein the reference element is coupled to the sense amplifier via a first input terminal;
a bit element comprising a second MTJ device and a second access device, wherein the bit element is coupled to the sense amplifier via a second input terminal; and a complementary metal oxide semiconductor (CMOS) resistor coupled to the second access device and the second MTJ device.

18. The input circuit of claim 17, wherein the CMOS resistor is configured to offset the first MTJ.

19. The input circuit of claim 17, wherein the reference element further comprises a bit line multiplexer, a bit line parasitic resistance, a source line multiplexer, a source line parasitic resistance, and a read pull-down device.

20. A bit memory element for calibrating a bit memory path of a sense amplifier circuit comprising:
   an MTJ device corresponding to a high resistive state,
   an access device, and
   a CMOS resistor shifter, wherein the CMOS resistor shifter of the bit memory element is configured to offset an impedance of the bit memory element to be greater than or less than the high resistive state.

21. The bit memory element of claim 20, wherein the bit element is integrated into the bit path of a sense amplifier input circuit.

22. The bit memory element of claim 20, further comprising a bit line multiplexer, a bit line parasitic resistance, a source line multiplexer, a source line parasitic resistance, and a read pull-down device.

* * * * *